United States Patent
Mizuno et al.

(10) Patent No.: US 6,937,496 B2
(45) Date of Patent: Aug. 30, 2005

(54) SEMICONDUCTOR DEVICE

(75) Inventors: Hiroyuki Mizuno, Kokubunji (JP); Takao Watanabe, Fucyu (JP); Mitsuru Hiraki, Kodaira (JP); Hitoshi Tanaka, Ome (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/757,441

(22) Filed: Jan. 15, 2004

(65) Prior Publication Data

US 2004/0145955 A1 Jul. 29, 2004

Related U.S. Application Data

(63) Continuation of application No. 10/319,511, filed on Dec. 16, 2002, now Pat. No. 6,711,071, which is a continuation of application No. 10/067,902, filed on Feb. 8, 2002, now Pat. No. 6,515,918, which is a continuation of application No. 09/639,742, filed on Aug. 15, 2000, now Pat. No. 6,366,506.

(30) Foreign Application Priority Data

Oct. 14, 1999 (JP) .......................................... 11-291809

(51) Int. Cl.[7] .............................................. G11C 11/36
(52) U.S. Cl. ..................................... 365/115; 365/226
(58) Field of Search ............................... 365/115, 226, 365/230.03, 189.11

(56) References Cited

U.S. PATENT DOCUMENTS

| | | |
|---|---|---|
| 5,448,526 A | 9/1995 | Horiguchi et al. |
| 5,528,548 A | 6/1996 | Horiguchi et al. |
| 5,592,421 A | 1/1997 | Kaneko et al. |
| 6,065,124 A | 5/2000 | Lee |
| 6,107,836 A | 8/2000 | Kawahara et al. |
| 6,222,355 B1 | 4/2001 | Ohshima et al. |

FOREIGN PATENT DOCUMENTS

JP     8-234851     9/1996

OTHER PUBLICATIONS

IEEE ISSCC Digest of Technical Papers, Feb., 1997, pp. 66–67.

IEEE ISSCC Digest of Technical Papers, Feb., 1986, pp. 266–267.

IEICE Transaction on Electron, vol. E75–C, No. 11, Nov. 1992, pp. 1333–1343.

*Primary Examiner*—Thong Q. Le
(74) *Attorney, Agent, or Firm*—Mattingly, Stanger, Malur & Brundidge, P.C.

(57) ABSTRACT

A semiconductor device having a first circuit block supplied with a first operating voltage, a second circuit block supplied with a second operating voltage, a voltage generating circuit for generating a third operating voltage in response to the first operating voltage, and a third circuit block supplied with the third operating voltage. Preferably, the third operating voltage is generated such that the first operating voltage is increased to a fourth operating voltage by a voltage-up converter, and then the fourth operating voltage is dropped to the third operating voltage by a voltage down-converter. Hence, a power supply operating internally stably in spite of use of a relatively fluctuating voltage can be provided even in the case where a power-supply voltage is dropped.

7 Claims, 29 Drawing Sheets

FIG.37
FIG. 37 (a)
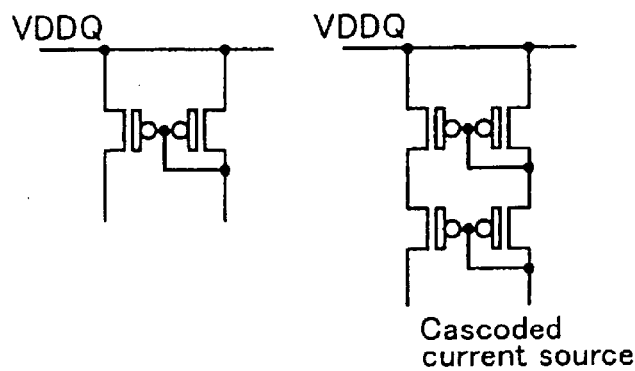
Cascoded current source
FIG. 37 (b)
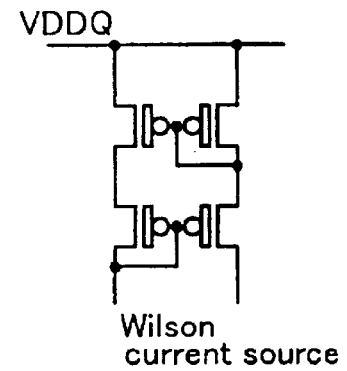
Wilson current source

SEMICONDUCTOR DEVICE

This is a continuation application of U.S. Ser. No. 10/319,511, filed Dec. 16, 2002 now U.S. Pat. No. 6,711,071, which is a continuation application of U.S. Ser. No. 10/067,902, filed Feb. 8, 2002, now U.S. Pat. No. 6,515,918, which is a continuation application of U.S. Ser. No. 09/639,742, filed on Aug. 15, 2000, now U.S. Pat. No. 6,366,506.

BACKGROUND OF THE INVENTION

The present invention relates to a semiconductor integrated circuit device and particularly to a high-speed low-power semiconductor integrated circuit device having various forms of circuit blocks mounted thereon by mixture.

A list of references in this specification is as follows. The references will be referenced by reference numerals.
[Reference 1]: M. Tsukude et al., 1997 IEEE International Solid-State Circuits Conference (ISSCC) Digest of Technical Papers, February 1997, pp.66–67
[Reference 2]: JP-A-8-234851 laid open on Sep. 13, 1966
[Reference 3]: S. Fujii et al., 1986 IEEE International Solid-State Circuits Conference (ISSCC) Digest of Technical Papers, February 1986, pp.266–267
[Reference 4]: H. Tanaka et al., IEICE Transaction on Electron, Vol.E75-C, No.11, November 1992, pp.1333–1343

A DRAM circuit operated by a power-supply voltage extVcc in a range of from 1.2 V to 3.3 V supplied from the outside of a chip is described in Reference 1. A word line drive voltage VccP is generated from extVcc by a voltage up-converter VppGen. On the other hand, an array voltage VccA, a peripheral circuit voltage Vpp and a shared-gate level (SGL) are generated from extVcc by respectively correspondingly exclusive voltage down-converters (VCDs).

A semiconductor integrated circuit device having a plurality of modules (circuit blocks) relating to a microcomputer, or the like, is described in Reference 2. Operating power-supply voltages for the plurality of modules are generated as follows. That is, a power-supply voltage Vcc supplied from the outside of a chip is once increased to a boosted voltage VH by a voltage up-converter 4. A plurality of voltage regulators provided so as to correspond to the plurality of modules reduce the boosted voltage VH to generate operating power-supply voltages which are adapted for the plurality of modules respectively and to supply the operating power-supply voltages to the plurality of modules respectively.

A semiconductor integrated circuit device operating with a single power-supply voltage is a subject of each of References 1 and 2. The inventors of the present application has made investigation, prior to the present invention, about a technique for mixing circuits such as DRAM circuits which require various kinds of operating power-supply voltages in a semiconductor integrated circuit supplied with two kinds of power supplies, that is, first power supply VDDQ for I/O circuits (signal input/output) and second power supply VDD for internal logic circuits.

Miniaturization of circuit elements in the inside of an integrated circuit (IC) particularly as represented by size of an MOS transistor has progressed to be adapted to recent improvement in function and speed of the IC owing to improvement in packing density of the IC. Problems against a flow of this technique are increase of power consumption owing to increase of the number of elements and reduction of breakdown voltage owing to the miniaturization of the circuit elements. As a result, reduction of the operating power-supply voltage should be promoted to solve the problems.

The first power supply VDDQ for I/O circuits, however, uses the same voltage for a relatively long term because VDDQ needs to be matched with lots of ICs having specifications determined in the past. Although it is a matter of course that reduction in VDDQ with the times is necessary, the rate of reduction of VDDQ is relatively moderate with respect to years and months. On the other hand, the second power supply VDD for internal logic circuits is free from such limitation of VDDQ, so that reduction of VDD has progressed at a rapid rate.

In order to mix DRAMs in the aforementioned situation, how to supply electric power to the DRAM circuit block is a problem to be solved. That is, the first power supply VDDQ for I/O circuits satisfies the condition of use as a power supply for the DRAM circuit block from the point of view that a relatively high power-supply voltage can be expected to be provided. The first power supply VDDQ, however, has a problem that power-supply noise is large because VDDQ is used for I/O circuits in which a relatively large current flows. That is, when the first power supply VDDQ is used directly for DRAM circuits, there is a fear that VDDQ cannot fulfil its performance sufficiently. On the other hand, it is also to be feared that the voltage of the second power supply VDD may be too low to supply power to the DRAM circuit block in the future because reduction of the voltage is progressing radically. That is, though a word line drive voltage needs the highest voltage in the DRAM circuit block, it is supposed that difficulty occurs in an aspect of power efficiency etc. when a technique which uses a charge pump voltage up-converter for generating the word line drive voltage from VDD is used. The aforementioned problem is not always limited to a chip having logic circuits and DRAMs mixed with the logic circuits. It is supposed that, the aforementioned problem occurs not only in the DRAM circuit block but also in analog circuits such as an AD converter, a DA converter and a PLL; circuits such as a flash memory; or logic circuits such as a microprocessor and a DSP which operate with a super-low voltage of 0.7 V or lower and which are sensitive to the fluctuation of the power-supply voltage.

SUMMARY OF THE INVENTION

Therefore, an object of the present invention is provide means for supplying an internal power-supply voltage stably and flexibly to solve the problem of operating voltage supply caused by a drop of the power-supply voltage supplied from the outside.

According to one aspect of the present invention:

A semiconductor device comprises a first circuit block supplied with a first operating voltage, a second circuit block supplied with a second operating voltage, a voltage generating circuit for generating a third operating voltage in response to the first operating voltage, and a third circuit block supplied with the third operating voltage.

Preferably, the third operating voltage is generated as follows. The first operating voltage is increased to a fourth operating voltage higher than the first operating voltage by a voltage up-converter. Then, the fourth operating voltage is dropped to the third operating voltage by a voltage down-converter. Hence, the operation of the semiconductor device can be kept stable even in the case where a power supply with a relatively fluctuating voltage as the first operating voltage is used.

BRIEF DESCRIPTION OF THE DRAWINGS

FIG. 37 shows modified examples of a load circuit of a differential amplifier used in the voltage down-converter.

DESCRIPTION OF EMBODIMENTS

Embodiments of the present invention will be described below in detail with reference to the drawings. Though not specifically limited, circuit elements constituting respective blocks in each embodiment are formed on a semiconductor substrate such as a single crystal silicone substrate by a known technique for an integrated circuit such as a complementary metal-oxide semiconductor (CMOS) transistor. In circuit symbols for metal-oxide semiconductor field effect transistors (MOSFET), MOSFET with no circular sign given to its gate designates an N-type MOSFET (NMOS) to be distinguished from a P-type MOSFET (PMOS) with a circular sign given to its gate. Hereinafter, MOSFET is simply abbreviated to MOS. Incidentally, the present invention is not limited to such a field effect transistor having an oxide film/electrically insulating film provided between a metal gate and a semiconductor layer, but it may be applied also to a circuit using a general FET such as a metal insulator semiconductor field effect transistor (MISFET).

Embodiment 1

Figure 1:
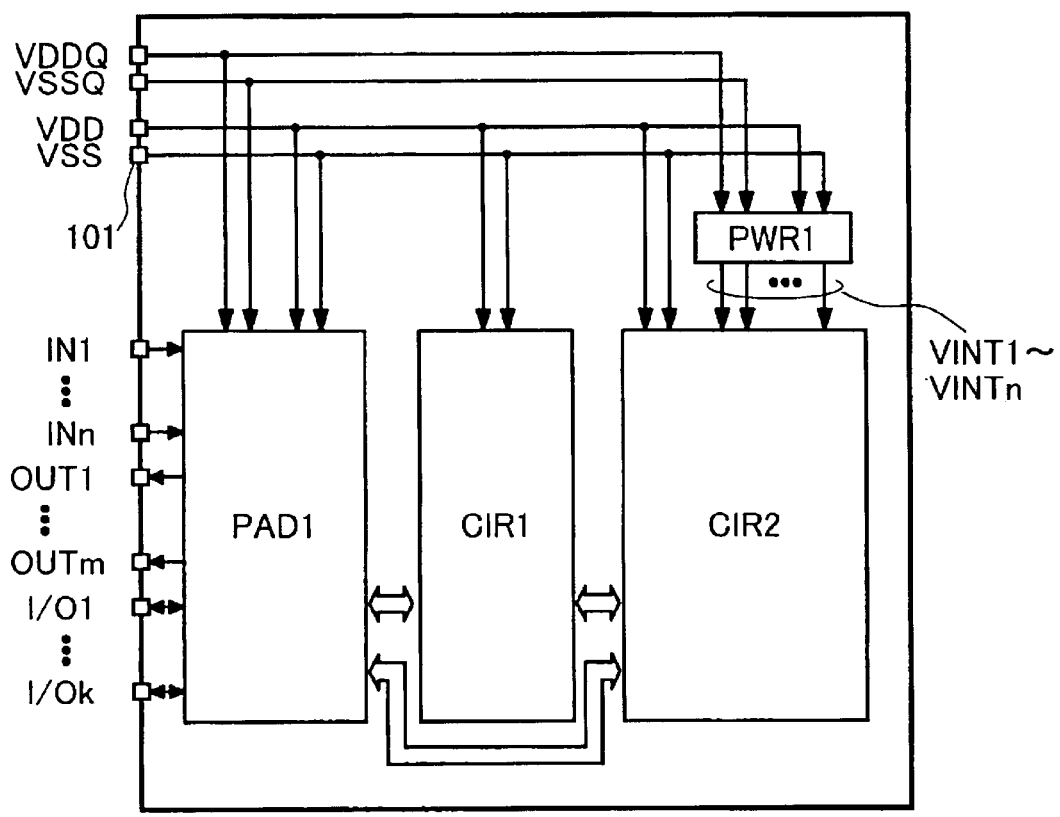
FIG. 1 is a diagram showing the overall configuration of a semiconductor integrated circuit as a subject of the present invention.

FIG. 1 shows the overall configuration of an embodiment of a semiconductor integrated circuit chip (hereinafter simply referred to as "silicon chip" or "chip") according to the present invention. The chip is supplied with I/O power-supply voltages VDDQ and VSSQ and core power-supply voltages VDD and VSS from the outside of the chip through individual power supply pads 101 respectively. VDDQ is a power supply for the I/O pins. VSSQ is the ground for the I/O pins. VDD is a core power supply voltage for the core circuitry. VSS is the ground for the core circuitry. Generally, an I/O voltage (VDDQ–VSSQ) is higher than a core voltage (VDD–VSS). A specific combination of power-supply voltages is not specifically limited. For example, a combination of an I/O voltage of about 3.3 V with a core voltage of about 1.5 V may be used typically. Generally, because both VSSQ and VSS have the same ground potential (GND) ideally, the I/O power-supply voltage and the core power-supply voltage will be hereinafter referred to as VDDQ and VDD respectively for the sake of convenience.

An I/O circuit PAD1 is a signal interface circuit for the outside of the chip. The I/O circuit PAD1 uses VDDQ and VDD as operating power-supply voltages. FIG. 1 illustrates signal input pads IN1 to INn and signal output pads OUT1 to OUTm for the outside of the chip and I/O signal pads I/O1 to I/Ok serving as both input pads and output pads. Incidentally, the amplitude of a signal given from the outside of the chip generally coincides with the voltage between VDDQ and VSSQ. VDD is an operating voltage of a first circuit block CIR1 (which will be described later) and coincides with the amplitude of a signal in CIR1. Hence, the I/O circuit PAD1 includes a level converter for converting a signal with an amplitude of VDDQ–VSSQ into a signal with an amplitude of VDD–VSS (or converting the latter into the former) to thereby form a signal interface for CIR1. Specific examples of the I/O circuit PAD1 will be described later with reference to FIGS. 16 through 18.

The first circuit block CIR1 is an internal circuit block that can operate with the core power-supply voltage VDD alone. Specific examples of circuit configuration of CIR1 are logic circuits such as an NAND circuit, etc.; register or static memory (SRAM) circuits; microprocessor or digital signal processing (DSP) circuits; and so on. CIR1 uses a signal with an amplitude of VDD–VSS to exchange signals with PAD1 and a second circuit block (which will be described later). An example of CIR1 will be described later with reference to FIG. 15.

On the other hand, the second circuit block CIR2 is a circuit block operating with VDDQ, VDD and other predetermined internal power-supply voltages VINT1 to VINTn. Specific examples of circuit configuration of CIR2 are analog circuits such as an AD converter, a DA converter, a PLL, etc.; and DRAM circuits. Specific examples further include microprocessor or DSP circuits, and so on, which operate with a super-low voltage of 0.7 V or lower, and which are sensitive to the fluctuation of the power-supply voltage. Specific examples of DRAM circuits for the second circuit block CIR2 will be described later with reference to FIGS. 8 through 14.

Finally, the voltage generating circuit block PWR1 is a circuit block for generating internal power-supply voltages VINT1 to VINTn necessary for CIR2. The voltage generating circuit block PWR1 uses VDDQ and VDD as its operating power-supply voltages. The above description has been made about the overall configuration of the semiconductor device as a subject of the present invention. The respective circuit blocks of the semiconductor device will be described below in detail.

[1. Voltage Generating Circuit Block PWR1]

Figure 2:
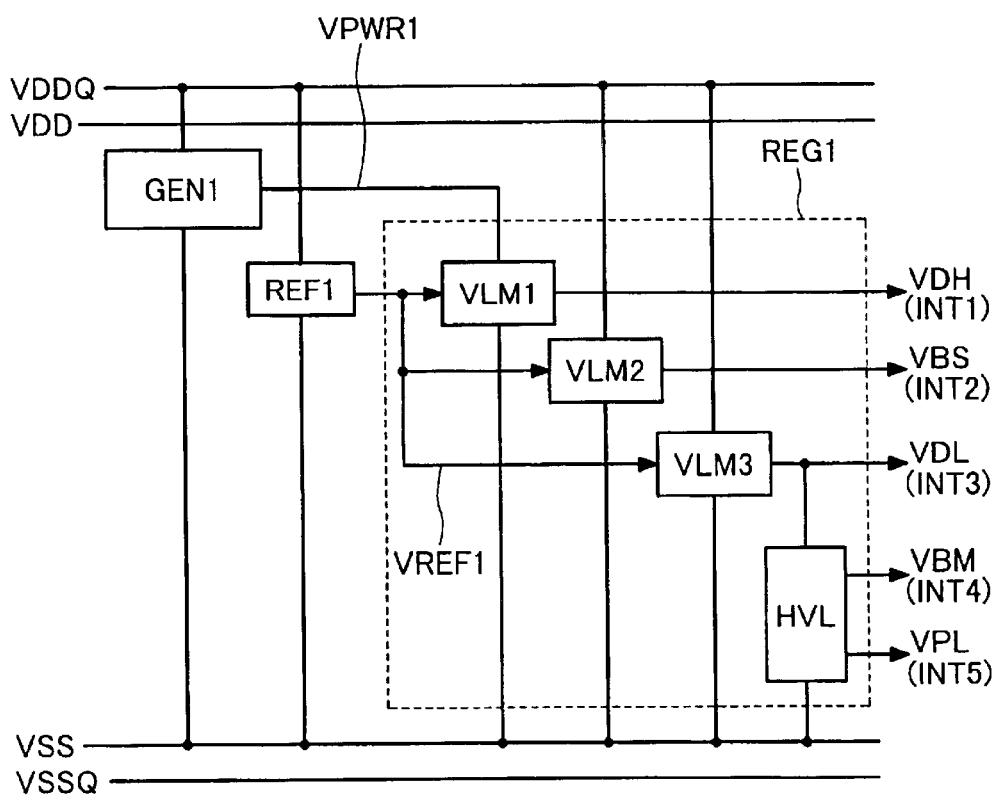
FIG. 2 is a diagram showing an example of the internal voltage generating circuit PWR1 in FIG. 1.

FIG. 2 shows an example of the voltage generating circuit block PWR1. Here is shown a specific example in the case where PWR1 is provided as a circuit for generating internal power-supply voltages required when the second circuit block CIR2 forms a DRAM circuit (which will be described later). Besides VDD given from the outside, a word line drive voltage VDH (for example, 3V), a sense amplifier overdrive voltage VBS (for example, 2V), an array voltage VDL (for example, 1.5 V), a precharge voltage VBM (for example, 0.75 V) and a plate voltage VPL (for example, 0.75 V) are needed as internal voltages by the DRAM circuit included in CIR2. In the most typical case, these internal power-supply voltages have the relations VDH>VBS>VDL>VBM=VPL=VDL/2.

In FIG. 2, generation of the word line drive voltage VHD as a voltage for driving a selected word line is one of the most characteristic portions of the present invention. That is, a voltage up-converter GEN1 receives the I/O voltage VDDQ (for example, 3.3 V) and generates a voltage VPWR1 (for example, 5 V) higher than VDDQ. Then, a voltage down-converter VLM1 (referred to also as "voltage limiter" or "regulator") generates VHD (for example, 3 V) by reducing the voltage VPWR1.

In this example, it is not impossible theoretically for a voltage down-converter to generate VHD from VDDQ by one step because of VDDQ>VHD. In the configuration according to the present invention, however, stable VDH can be generated from the power supply such as VDDQ for I/O circuits on which noise is in most cases superposed. Particularly when the power-supply voltage VDDQ is near the power-supply voltage VDH (roughly, VDDQ≧VDH≧VDDQ−0.5V), the problem that it is more difficult to form the voltage down-converter actually for generating stable VDH is also solved. On the other hand, a voltage up-converter may be used for generating VHD from VDD by one step in order to avoid the aforementioned problem caused by use of VDDQ. In this case, however, reduction of VDD results in the necessity of making the voltage-increasing ratio relatively large. Hence, it becomes difficult to form a low-power voltage up-converter because efficiency of the voltage-up converter is lowered. According to the present invention, however, the problem can be solved, so that power saving can be achieved in spite of use of a voltage up-converter relatively small in voltage-increasing ratio.

Voltage down-converters VLM2 and VLM3, which are provided to correspond to the sense amplifier overdrive voltage VBS and the array voltage VDL respectively, generate the sense amplifier overdrive voltage VBS and the array voltage VDL respectively by reducing VDDQ. Each of VLM2 and VLM3 is achieved by a circuit of the same type as that in VLM1 except that the operating power-supply voltage is VDDQ. Each of the precharge voltage VBM and the plate voltage VPL is provided as VDL/2 generated from VDL. A circuit described in Reference 3 can be used as a specific example of a circuit for generating VDL/2.

Figure 3:
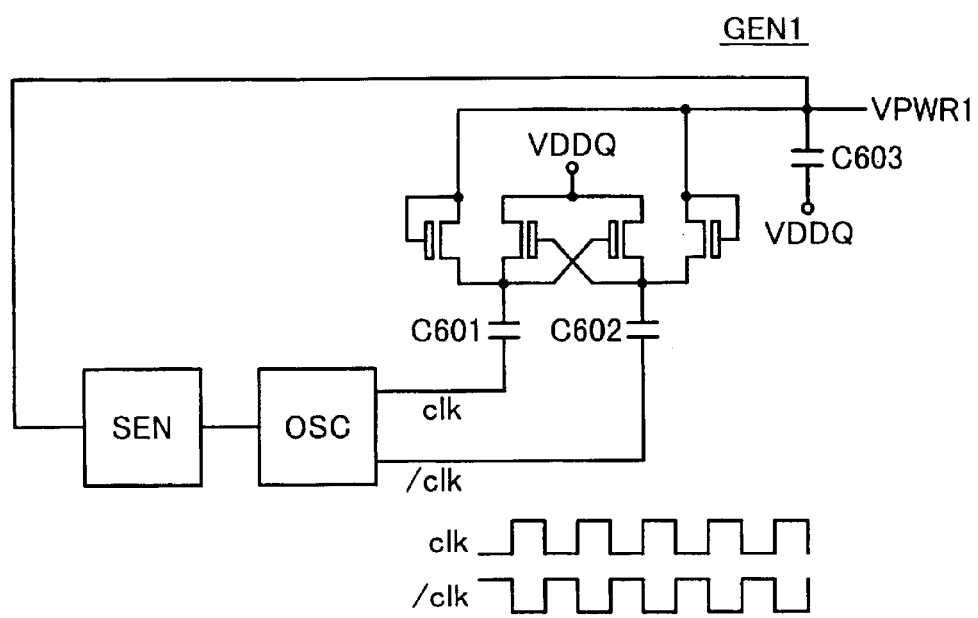
FIG. 3 is a diagram showing an example of the voltage up-converter GEN1 in FIG. 2.
Figure 31:
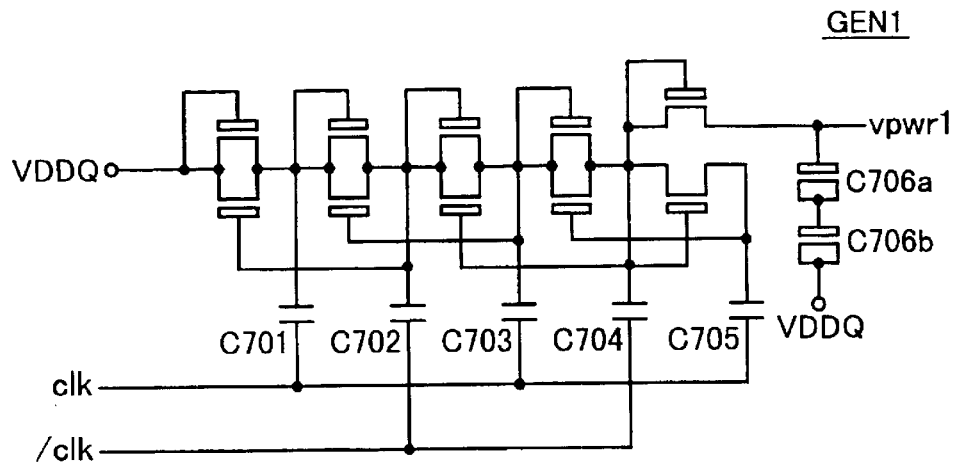
FIG. 31 is a diagram showing another example of the voltage up-converter GEN1.

FIG. 3 shows a specific example of the voltage up-converter GEN1 using a charge pump method in FIG. 2. In FIGS. 3 and 31, C601, C602, C701 to C705 are pumping capacitors respectively and C603, C706a and C706b are decoupling capacitors respectively. OSC is an oscillator. SEN is a level sensor. Though not shown, the level sensor may be formed to compare the size of a voltage VPWR1 generated on the basis of a reference voltage VREF1 generated by a reference voltage generating circuit which will be described later. In this case, stabilization of the fluctuation of the generated voltage VPWR1 or the fluctuation of the power supply is achieved more greatly. OSC outputs clock signals clk and /clk with a phase difference of 180 degrees. Electric charges accumulated in the pumping capacitors on the basis of the clock signals clk and /clk are transferred to the smoothing capacitors respectively connected to VPWR1, so that a higher-potential voltage than VDDQ is obtained in VPWR1. The pumped voltage VPWR1 is monitored by SEN to control the oscillation of OSC to thereby control the voltage VPWR1 to a desired value.

Figure 4:
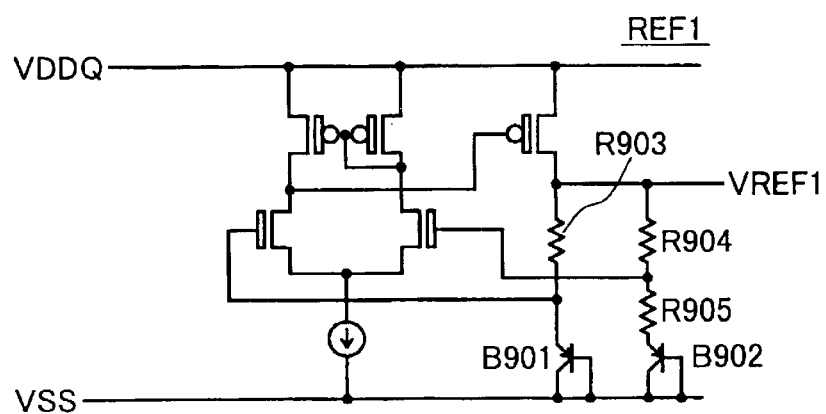
FIG. 4 is a diagram showing an example of the reference voltage generating circuit REF1 in FIG. 2.

FIG. 4 shows a so-called band-gap reference-voltage generator as the reference voltage generating circuit REF1 in FIG. 2. R903 to R905 are resistors respectively. B901 and B902 are PNP bipolar transistors respectively. Though not limited specifically, the PNP bipolar transistors can use parasitic bipolar transistors formed between a diffusing layer and well, which is used in a drain or source of an MOS transistor, and a substrate in a CMOS process. If there is no process problem, the reference voltage generating circuit using the bipolar transistors is suitable as a reference voltage generating circuit according to the present invention because the temperature characteristic of its output voltage VPWR1 is very small.

The reference voltage generating circuit REF1 is provided to operate with the I/O voltage VDDQ as its operating power supply. Because the output reference voltage VREF1 of the reference voltage generating circuit REF1 is about 1.2 V near to the band gap of silicon, a power supply with a voltage of 1.2 V or higher is required necessarily to be the power supply of the circuit REF1. Hence, this is because there is a possibility that the use of the core voltage VDD as a power supply for REF1 is a barrier to an attempt to reduce the voltage VDD. That is, this is because REF1 cannot operate stably when VDD is reduced to about 1 V. In order to operate REF1 still with VDD as its operating voltage in this case, a voltage up-converter (for example, the same one as in FIG. 3) for generating a voltage higher than VDD from VDD may be used to generate VDDR so as to operate REF1 with VDDR instead of VDDQ in FIG. 4. Although FIG. 4 shows the case where a band gap reference voltage generating system is used, the present invention may be applied also to the case where a circuit using a threshold voltage of an MOS transistor is used as another system or the case where a circuit using the difference between threshold voltages of two transistors different in threshold voltage is used as another system.

Figure 5:
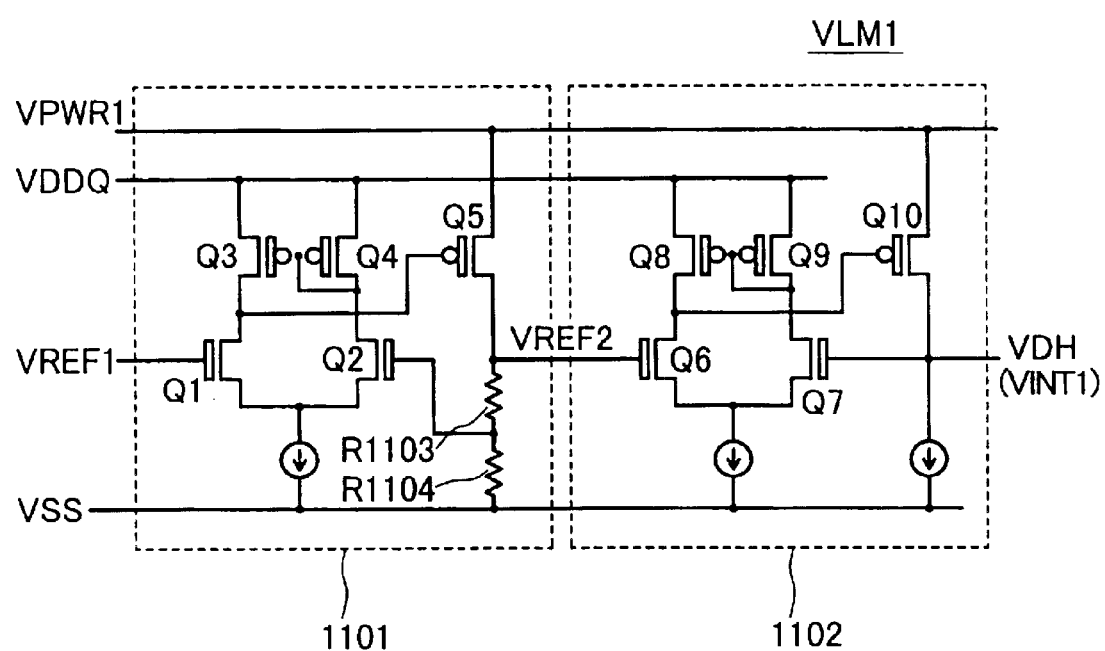
FIG. 5 is a diagram showing an example of the voltage down-converter VLM1 in FIG. 2.

FIG. 5 shows a specific example of the voltage down-converter VLM1 in FIG. 2. This circuit is applied also to VLM2 for generating VBS and VDL by reducing VDDQ. In FIG. 5, the reference numerals 1101 and 1102 designate circuits for generating reduced voltages corresponding to reference voltages by negative feedback operations respectively. Each of the circuits 1101 and 1102 includes an operational amplifier constituted by a differential amplifier, and an output P-channel MOS with a gate controlled by the output of the differential amplifier. Circuits of this type have been described in Reference 4. The circuit 1101 is a voltage limiter circuit for converting the level of the reference voltage. The circuit 1101 receives VREF1 generated by REF1 and generates a second reference voltage VREF2 equal to a desired internal voltage by comparing VREF1 with a tap voltage at a junction between resistors R1103 and R1104. VREF2 is a voltage substantially equal to VDH. The circuit 1101 is used because a voltage equal to VDH can be hardly directly generated by the circuit for VREF1 shown in FIG. 4. If a voltage equal to the internal voltage can be generated directly from VREF1, the circuit 1101 may be omitted so that REF1 is directly connected to the voltage limiter circuit 1102 as an internal voltage output buffer. In FIG. 5, the differential amplifiers and the output MOSs are provided to operate with the boosted voltage VPWR1.

Figure 6:
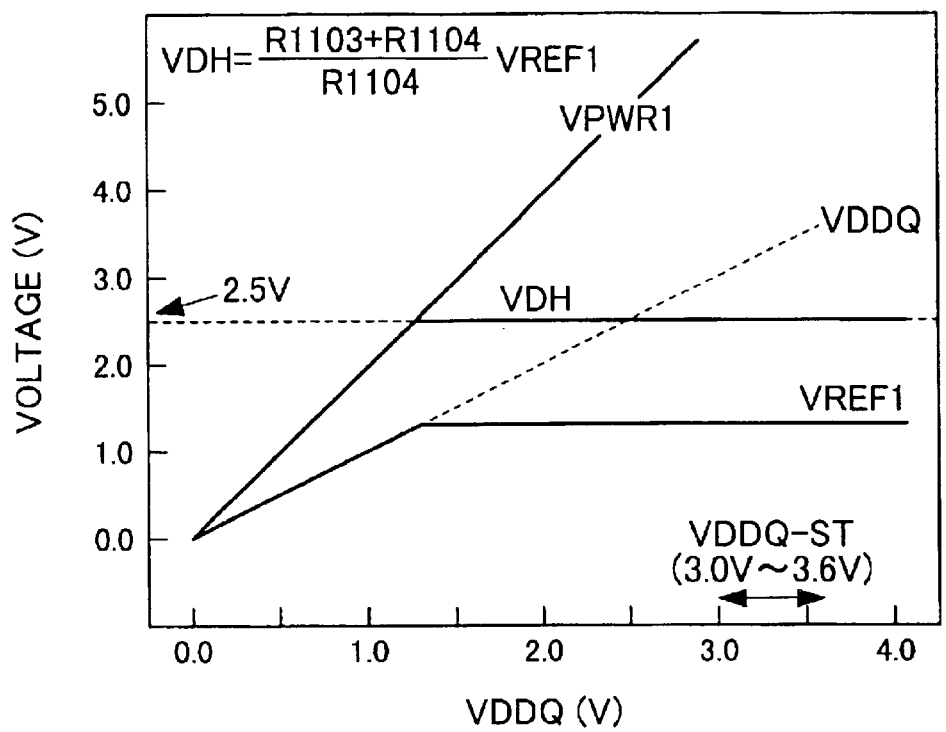
FIG. 6 is a graph showing an example of characteristic of the voltage down-converter VLM1 of FIG. 5 with respect to VDDQ.

FIG. 6 shows voltage dependence on VDDQ, of VREF1, VPWR1 and VDH generated by the method of the present invention as shown in FIGS. 2 through 5. VREF1 is output as a constant voltage of VREF1=1.2 V when VDDQ is not lower than about 1.2 V. VPWR1 is generated as a voltage that depends linearly on the increase of VDDQ. VLM1 generates VINT1 on the basis of these voltages VREF1 and VPWR1. In FIG. 6, the relation (R1103+R1104)/R1104=2.5/1.2 is set, so that a constant voltage of VHD=2.5 V is obtained for VDDQ>1.2 V. Assuming now that the voltage VDDQ supplied from the outside of the chip has a center value of 3.3 V and a guaranteed standard operating voltage range VDDQ-ST of from 3.0 V to 3.6 V, it is apparent that VDH is obtained as a constant voltage of 2.5 V when VDDQ is in the voltage range.

Figure 7:
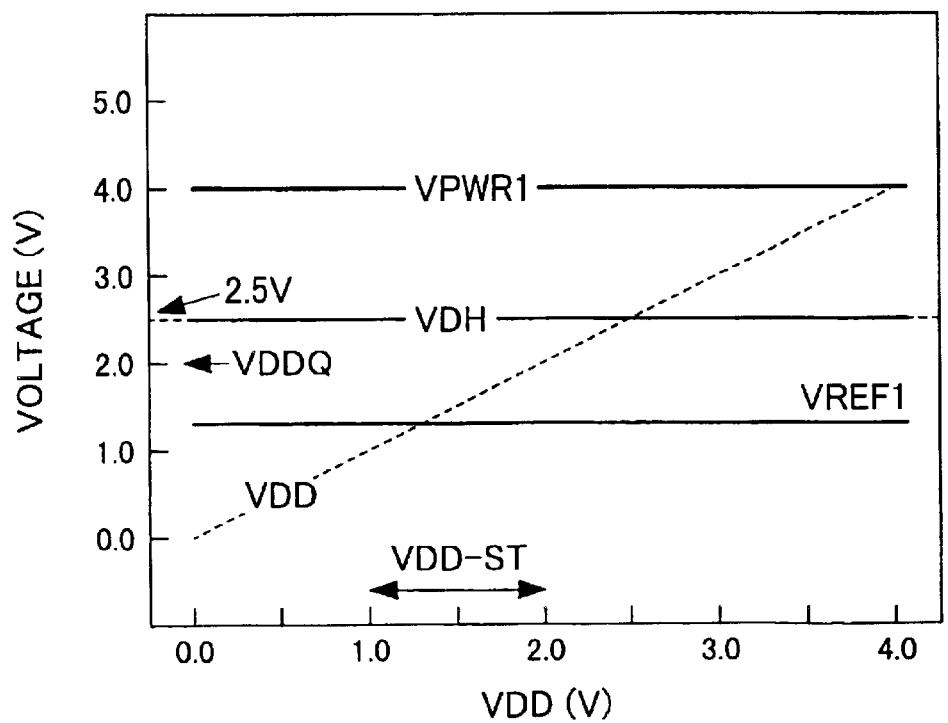
FIG. 7 is a graph showing an example of characteristic of the voltage down-converter VLM1 of FIG. 5 with respect to VDD.

On the other hand, FIG. 7 shows voltage dependence on VDD, of VREF1, VPWR1 and VDH generated by the method of the present invention as shown in FIGS. 2 through 5. Because VDD is not used in any of the circuits shown in FIGS. 2 through 5, the voltage dependence on VDD, of each of VREF1, VPWR1 and VDH (VINT1) is flat as shown in FIG. 7. Even in the case where the guaranteed operating voltage range of VDD in the chip is set, for example, to a wide range of from 1.0 V to 2.0 V, VINT1 is obtained as a constant value of 2.5 V.

As described above, the present invention is characterized in that a constant voltage VINT1 is obtained without reducing the voltage VINT1 supplied to the circuit CIR2 even in the case where the voltage VDD is reduced for power saving of the circuit such as the circuit CIR1 in FIG. 1. Even in the case where a circuit such as DRAM that acutely deteriorates in speed, or the like, due to reduction of voltage is used as CIR2, DRAM can be operated at a high speed in spite of reduction of VDD if voltages VINT1 to VINTn having no voltage dependence on VDD are used in the DRAM circuit.

[2. Second Internal Circuit Block CIR2]

Figure 8:
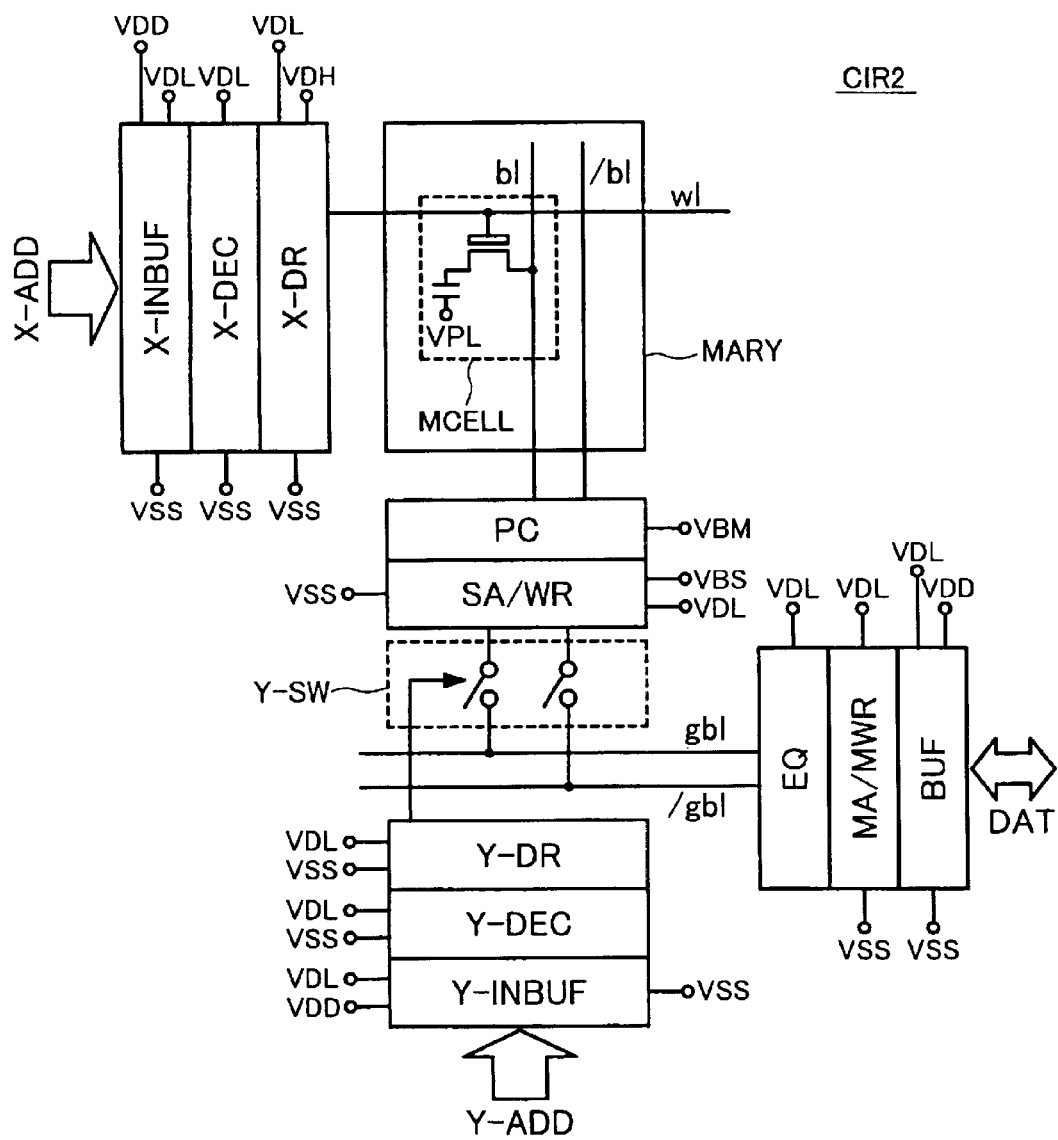
FIG. 8 is a diagram showing an example of the second internal circuit block CIR2 in FIG. 1.

FIG. 8 shows a DRAM circuit as an example of the second internal circuit block CIR2. In FIG. 8, X-INBUF and Y-INBUF are X-address and Y-address input buffers respectively. For example, each of the X-address and Y-address input buffers receives an address signal with a signal amplitude of VDD−VSS given from the first circuit block and converts the address signal into a signal with an amplitude of VDL. These address signals are transmitted to X-address and Y-address decoders X-DEC and Y-DEC respectively and decoded by the X-address and Y-address decoders X-DEC and Y-DEC respectively to determine selected one of word lines or column selection lines. The X-address decoder X-DEC generates a signal for selecting one of word drivers X-DR. The selected word driver drives a corresponding word line WL to operate with VDH.

MARY is a memory cell array having an array of dynamic memory cells MCELL. wl is a word line connected to a gate signal of a memory cell. bl and /bl are bit lines for reading/writing information from/into the memory cell. Incidentally, bl and /bl are a pair of bit lines. PC is a bit line precharge circuit for precharging the bit lines to VBM=VDL/2 in a non-selection mode. SA/WR is a sense amplifier/write amplifier circuit for discriminating between a high level and a low level of a signal read from a selected memory cell and amplifying the signal level to VSS or VDL. The Y address given from Y-INBUF is decoded by Y-DEC, so that one of predetermined column selection lines is selected by a Y-driver Y-DR. A so-called Y-switch Y-SW is turned on by the column selection line, so that the selected pair of bit lines bl and /bl are connected to a pair of global bit lines gbl and /gbl respectively. EQ is an equalizing circuit for the global bit lines. MA/MWR is a main sense amplifier/main write amplifier circuit for the global bit lines. BUF is a buffer circuit for converting the signal amplitude in the internal circuit of CIR2 and the signal amplitude in the external circuit of CIR2 into each other.

Figure 9:
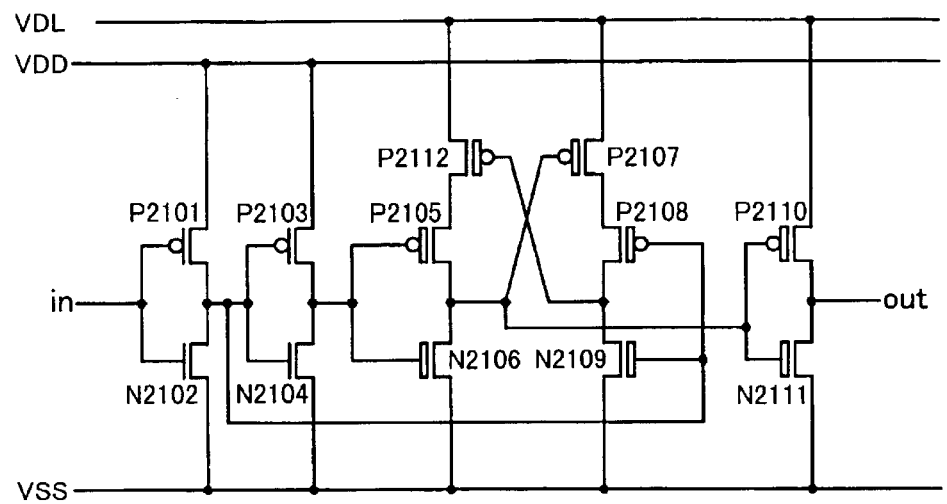
FIG. 9 is a diagram showing an example of the level conversion circuit (VDD amplitude to VD amplitude) used in FIG. 8.
Figure 10:
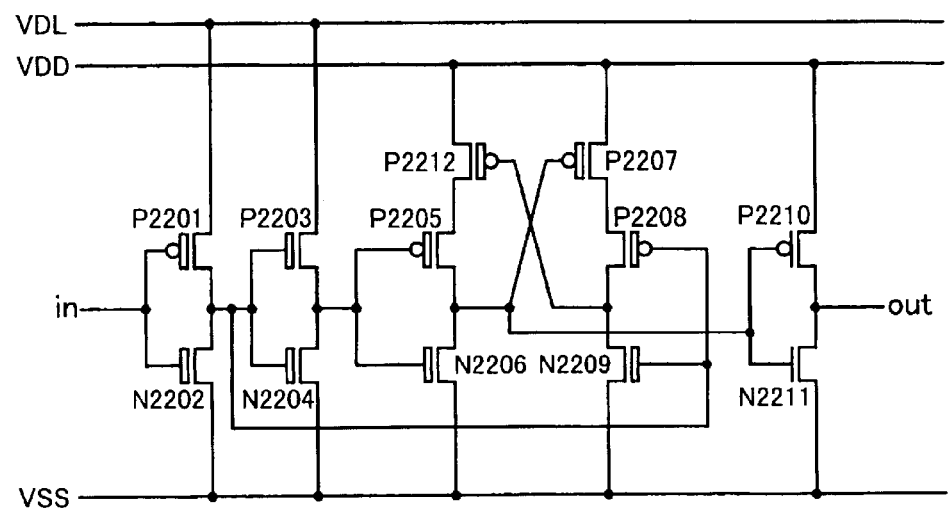
FIG. 10 is a diagram showing an example of the level conversion circuit (VDL amplitude to VDD amplitude) used in FIG. 8.

FIG. 9 shows a specific example of configuration of the buffer circuit for converting a signal with an amplitude of VDD into a signal with an amplitude of VDL. FIG. 10 shows a specific example of configuration of the buffer circuit for converting a signal with an amplitude of VDL into a signal with an amplitude of VDD. The buffer circuits shown in FIGS. 9 and 10 can be used as X-INBUF, Y-INBUF and BUF in FIG. 8. Even in the case where VDD varies in a wide voltage range of from 1.0 V to 2.0 V as described in this embodiment, an interface operation between the internal circuit of CIR2 and the external circuit of CIR2 can be made at a high speed through these buffer circuits without generating any feedthrough current.

Figure 11:
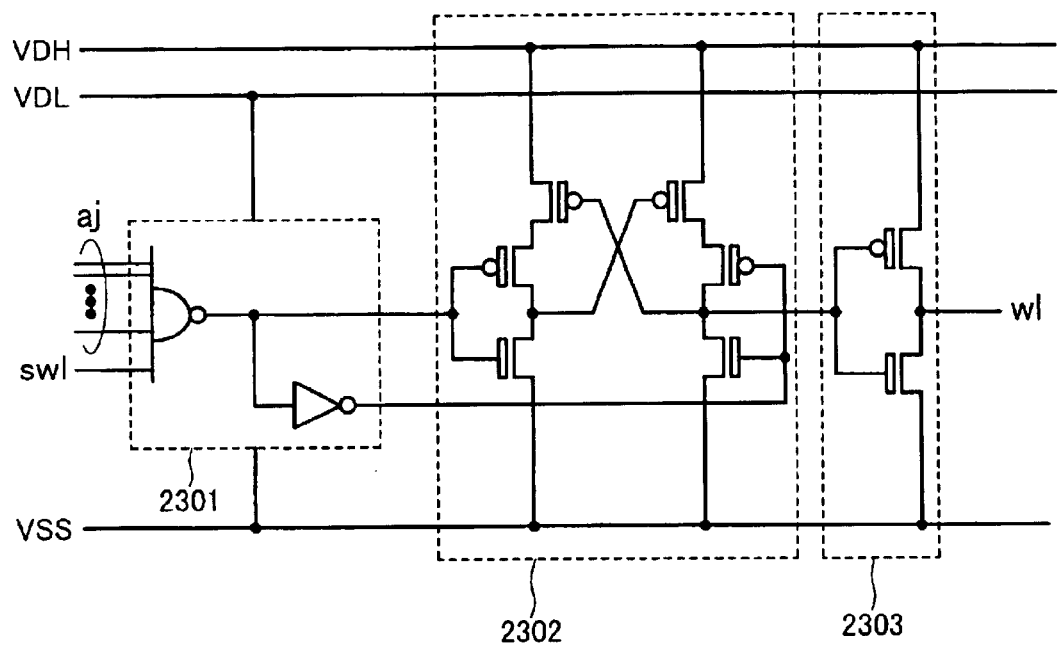
FIG. 11 is a diagram showing an example of the decoding circuit and the word line drive circuit used in FIG. 8.

FIG. 11 shows a specific example of the X-address decoder X-DEC and the word driver X-DR in FIG. 8. In FIG. 11, the reference numeral 2301 designates a decoder circuit that decodes a plurality of X-address signals aj and a word line drive signal swl from X-INBUF. The reference numeral 2302 designates a level conversion circuit by which the amplitude level VDL of a signal as a decoding result is converted into an amplitude of the word line boosted voltage VDH. The reference numeral 2303 designates an X-driver circuit for driving the word line wl.

Figure 12:
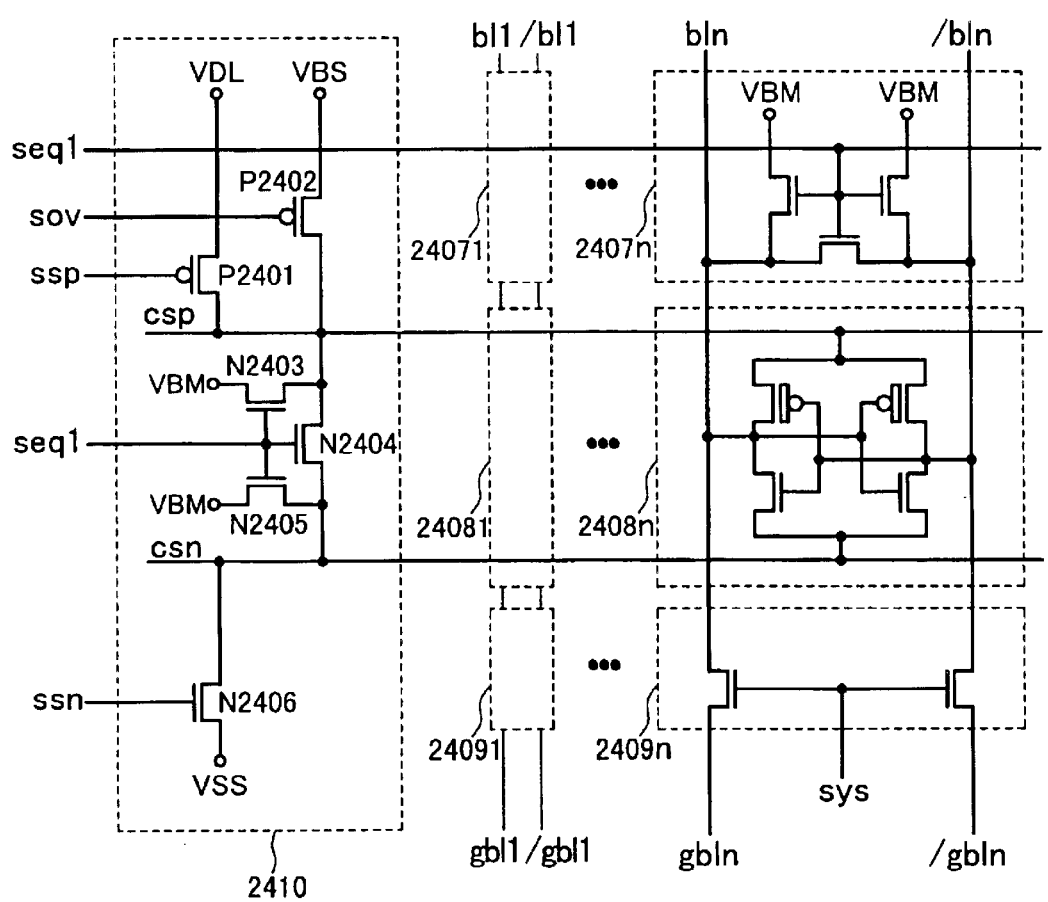
FIG. 12 is a diagram showing an example of circuit configuration in the neighborhood of the sense amplifier used in FIG. 8.

FIG. 12 shows a detailed circuit of PC, SA/WR and Y-SW in FIG. 8. In FIG. 12, the reference numerals 24071 to 2407n designate precharge circuits PC respectively; 24081 to 2408n, sense amplifier/write amplifier circuits SA/WR respectively; and 24091 to 2409n, Y-switches Y-SW respectively. A sense amplifier circuit of a CMOS latch type is used in SW/WR. Y-SW is constituted by a pass transistor circuit using NMOS. In FIG. 12, the precharge circuit PC is constituted by NMOS because the precharge level of the bit lines bl and /bl is a half of the array voltage VDL (according to a so-called half precharge system). The reference numeral 2410 designates a circuit for driving the aforementioned circuits.

Figure 13:
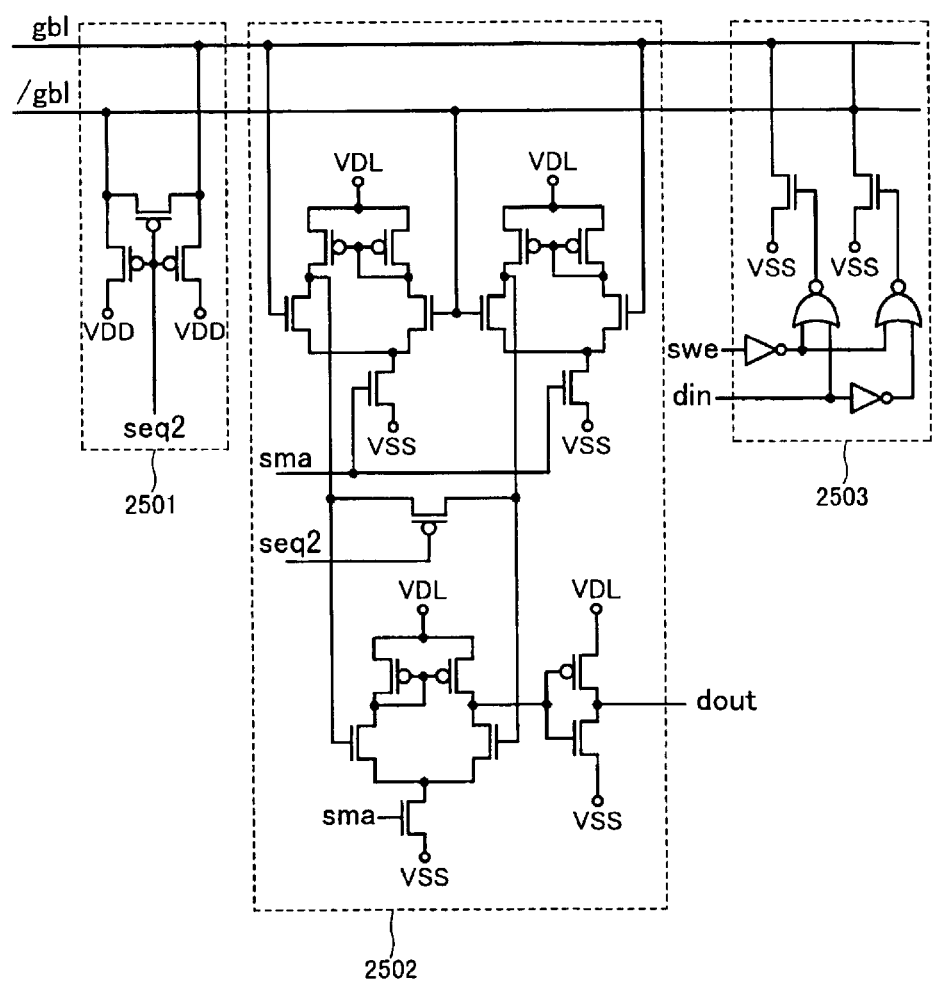
FIG. 13 is a diagram showing an example of circuit configuration of the main amplifier used in FIG. 8.

FIG. 13 shows a specific example of the equalizer circuit EQ and the main sense amplifier/main write amplifier circuit MA/MWR in FIG. 8. In FIG. 13, the reference numeral 2501 designates EQ; 2502, MA; and 2503, MWR. In FIG. 13, the equalizer circuit EQ is constituted by PMOS and the main write amplifier MWR is constituted by NMOS to drive the global bit lines gbl and /gbl because the precharge level of the global bit lines gbl and /gbl is set to the array voltage VDL. A current mirror sense amplifier is used as the main sense amplifier MA for the purpose of increasing speed.

Figure 14:
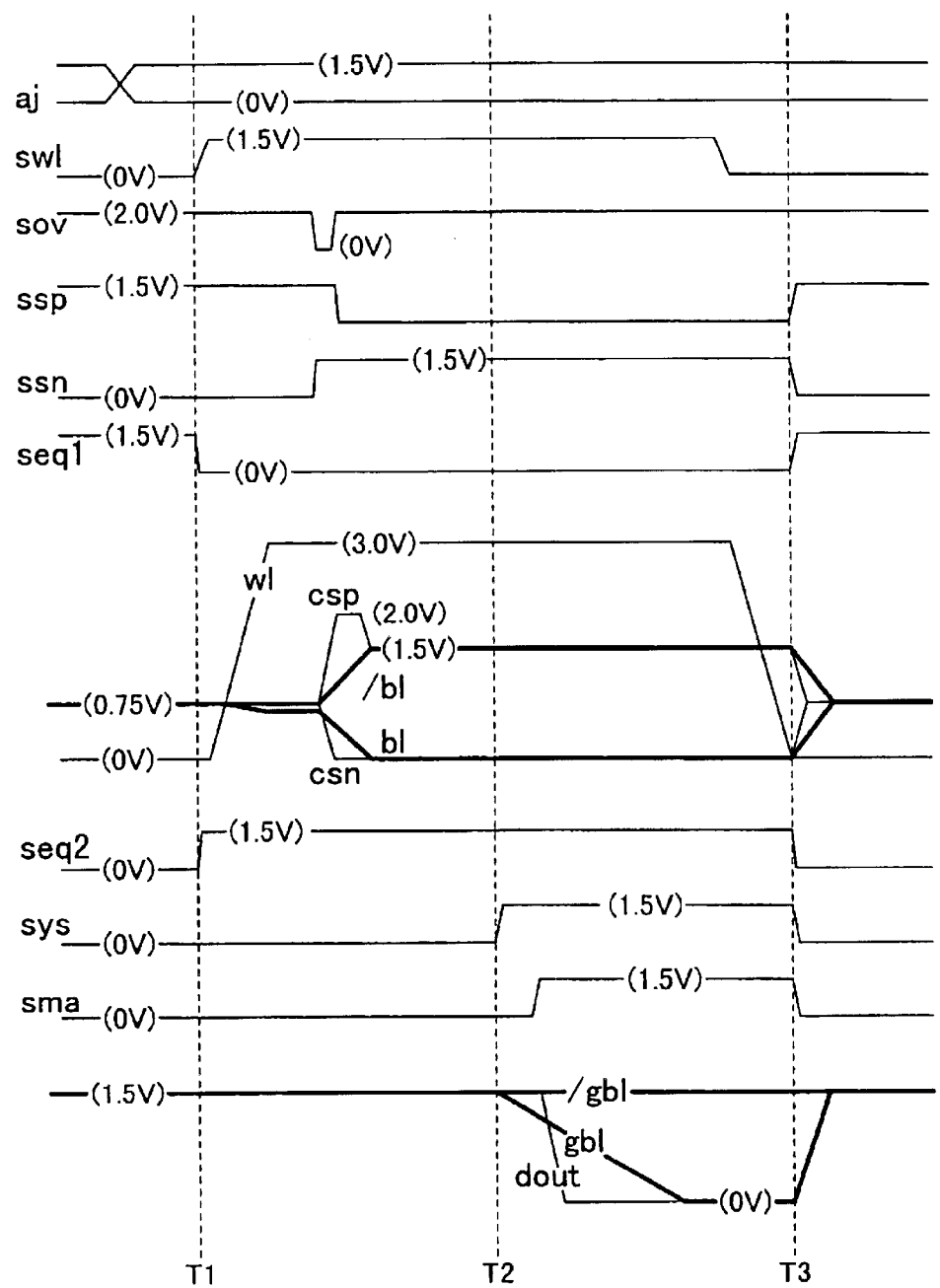
FIG. 14 is a time chart showing operating waveforms of the circuit in FIG. 8.

FIG. 14 shows operating waveforms in the DRAM circuit shown in FIGS. 8 through 13. In FIG. 14, a reading operation is shown as an example. After the address is determined, the level of seq1 is turned to "L" at a point of time T1 to cancel the precharge of the bit lines. At the same time, the level of sw1 is turned to "H" to drive wl from VSS to VDH. As a result, the contents of the memory cell are reflected in the bit lines. Then, the level of sov is turned to "L" and the level of ssn is turned to "H" to overdrive the sense amplifier. As a result, the potentials of csp and csn are driven from 0.75 V to 2.0 V and 0 V respectively. After the potentials of the bit lines are amplified by the sense amplifier, the level of sov is returned to "H" and the level of ssp is driven to "L". As a result, csp is driven to 1.5 V so that the potentials of the bit lines bl and /bl are amplified to 1.5 V and 0 V respectively.

At a point of time T2, the level of sys is driven to "H" so that the selected Y-SW is turned on. As a result, the potentials of corresponding bit lines are reflected in the global bit lines. Driving the level of sma to "H" makes the main sense amplifier operate so that the potentials of the global bit lines are amplified and output as dout.

At a point of time T3, each of the control signals is turned to a negate state and the levels of seq1 and seq2 are turned to "H" and "L" respectively so that the bit lines and the global bit lines are precharged.

In the aforementioned DRAM circuit, the high-speed operation of DRAM is guaranteed because the interval voltage greatly depending on the speed of a reading/writing operation inside DRAM does not change even in the case where the core voltage VDD used in CIR1 is reduced, for example, from 1.5 V to 1.0 V. The utilization of this characteristic permits the core voltage VDD to change in accordance with the operating state of CIR1, so that electric power consumed by the chip as a whole can be reduced greatly. In this case, a power supply circuit for generating the core voltage VDD, for example, may be added to the outside of the chip. Further, a control circuit for controlling the output voltage (=core voltage VDD) of the power supply circuit, for example, may be provided inside CIR1.

If the operating frequency of CIR1 is controlled in accordance with the operating state of CIR1 while the core voltage VDD supplied to CIR1 dynamically is controlled to change in accordance with the operating state of CIR1, electric power consumed by CIR1 can be reduced to the minimum requirement for operating CIR1.

Incidentally, in the embodiment shown in FIGS. 8 through 14, the array voltage VDL is set to be different from the core voltage VDD of the chip. Generally, the power-supply voltage consuming the largest amount of current in all power-supply voltages for DRAM is in most cases the array voltage VDL for charging/discharging the bit lines. When the array voltage is generated by the regulator VLM shown in FIG. 5, a larger amount of electric power for the voltage conversion efficiency of the regulator is consumed. Therefore, the arrange voltage is preferably directly supplied from a pad of the chip. For example, the core voltage VDD of the chip may be used directly as the array voltage. In this case, the array voltage varies in accordance with reduction of the core voltage. However, if the sense amplifier drive method by means of a so-called overdrive system as shown in FIG. 12 is used, the deterioration of DRAM speed with the reduction of the core voltage can be suppressed to be substantially equivalent to the deterioration of speed of the circuit CIR1 constituted by a CMOS logic circuit with the reduction of the core voltage.

[3. First Internal Circuit Block CIR1]

Figure 15:
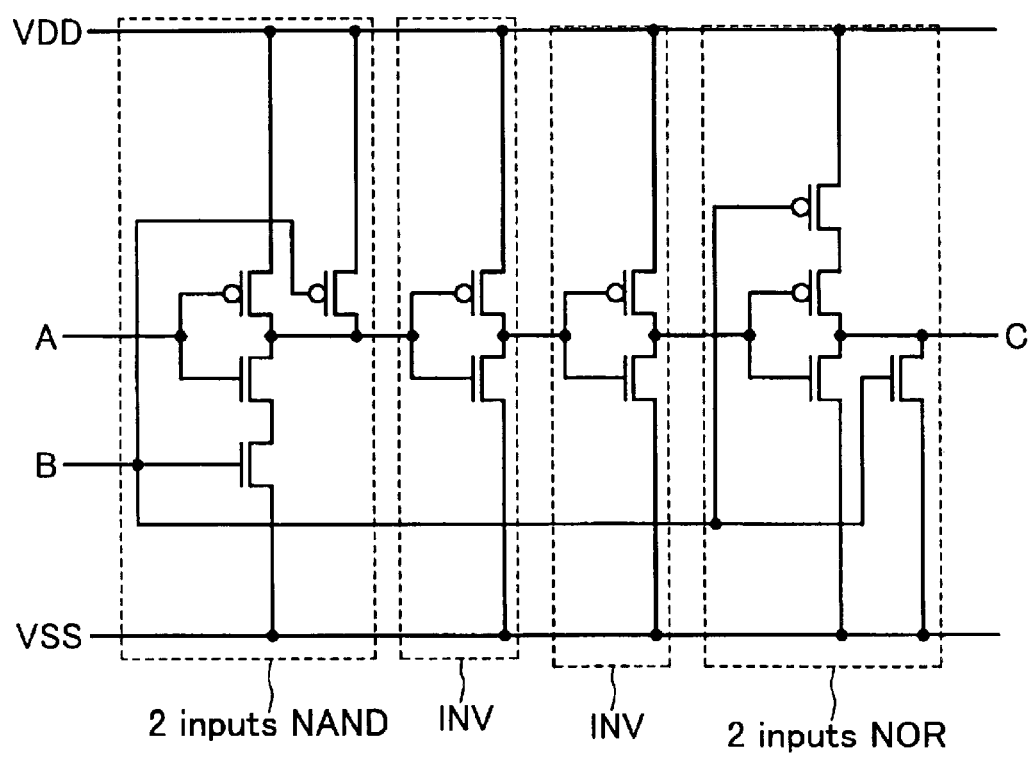
FIG. 15 is a diagram showing an example of the first internal circuit block CIR1 in FIG. 1.

FIG. 15 shows a specific example of one of elemental circuits constituting the first internal circuit block CIR1 in FIG. 1. The elemental circuit shown in FIG. 15 is composed of two inverters (INV), one two-inputs NAND, and one two-inputs NOR. The logic circuit is disposed between VDD and VSS. Each of I/O signals A, B and C has an amplitude of VDD–VSS.

The first internal circuit block is formed, for example, as a microprocessor CPU, by use of the elemental circuit shown in FIG. 15, and so on. Data and instructions necessary for the CPU are stored in the second circuit block including the aforementioned DRAM. That is, the CPU issues an address of required data to DRAM and receives information stored in a memory cell corresponding to the address. When a predetermined data needs to be stored in DRAM, the CPU issues the data and its address both to be stored to the DRAM circuit.

[4. I/O Circuit PAD1]

Figure 16:
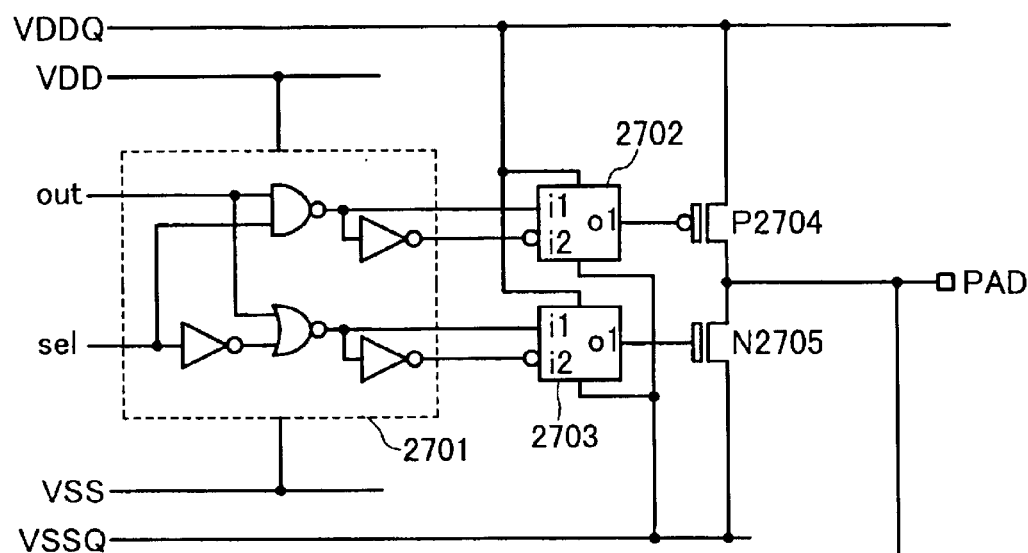
FIG. 16 is a diagram showing an example of the I/O circuit block PAD1 in FIG. 1.
Figure 16:
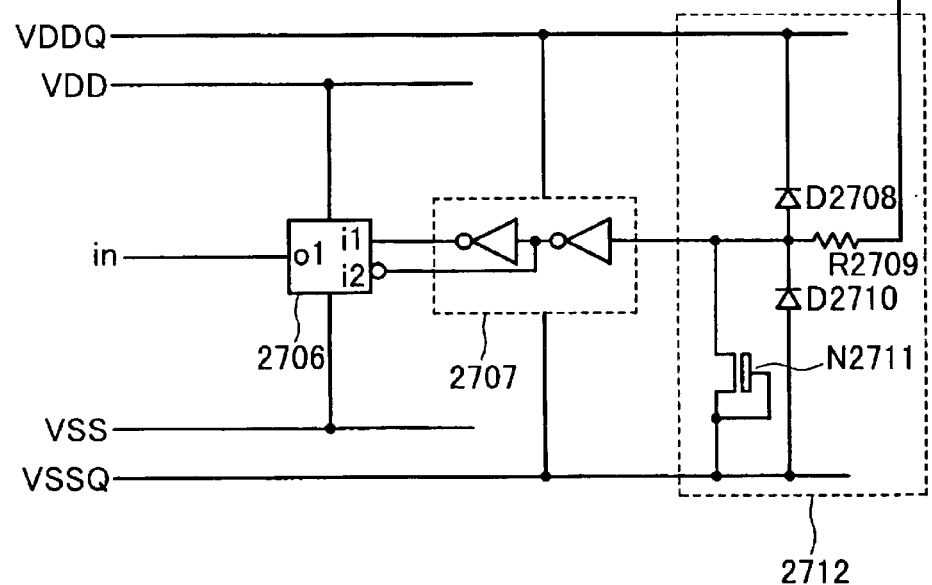

FIG. 16 shows a specific example of the I/O circuit PAD1 in FIG. 1. In FIG. 16, the reference numerals 2702 and 2703 designate level conversion circuits, a detailed circuit example of which will be described later. The reference numerals 2701, 2702, 2703, P2704 and N2705 designate constituent members of an output buffer. When the levels of sel and out are "H" and "H" respectively, the transistor P2704 is turned on so that the VDDQ potential is output at PAD. When the levels of sel and out are "H" and "L" respectively, the transistor N2705 is turned on so that the VSSQ potential is output at PAD. On the other hand, when the level of sel is "L", the transistors P2704 and N2705 are turned off so that PAD serves as an input pin.

The reference numeral 2712 designates a protective circuit which is called "electrostatic discharge device (ESD)" and which is connected to PAD in order to prevent circuits inside the chip from being destroyed by external noise such as static electricity applied to PAD. The reference numerals D2708 and D2710 designate diodes respectively; R2709, a resistor; and N2711, an NMOS transistor. The reference numeral 2706 designates a level conversion circuit, a detailed circuit example of which will be described later.

The reference numerals 2712, 2707 and 2706 designate constituent members of an input buffer. When PAD is driven to the VDDQ level, the VDD potential is output at "in". When PAD is driven to the VSSQ level, the VSS potential is output at "in".

Figure 17:
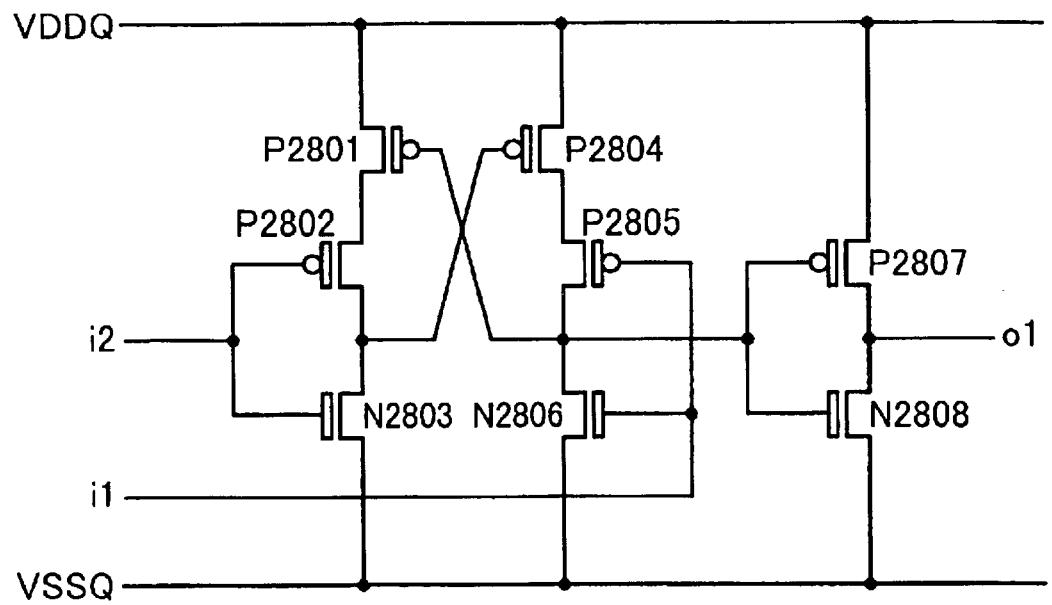
FIG. 17 is a diagram showing an example of the level conversion circuit (VDD amplitude to VDDQ amplitude) used in FIG. 16.
Figure 18:
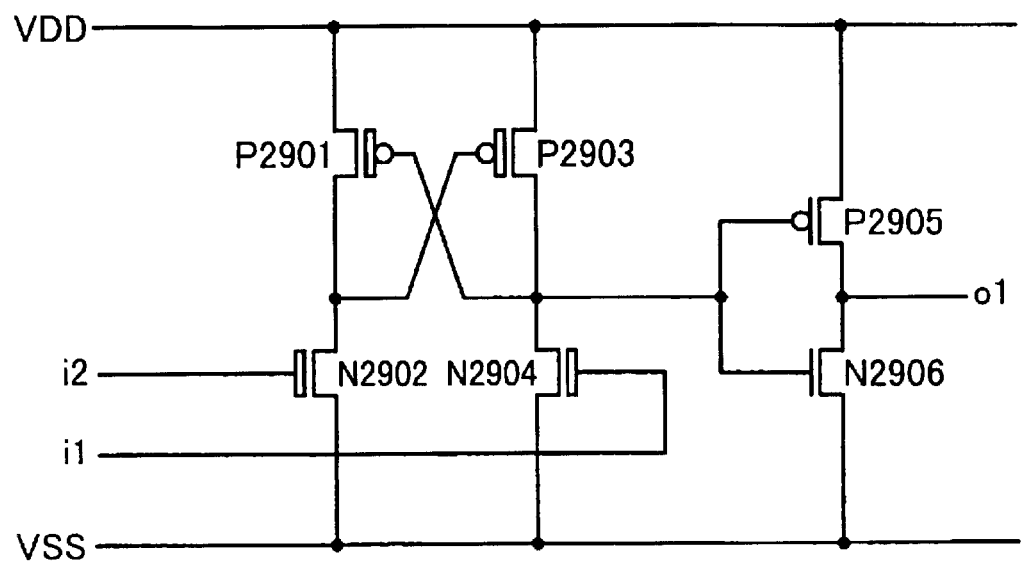
FIG. 18 is a diagram showing an example of the level conversion circuit (VDDQ amplitude to VDD amplitude) used in FIG. 16.

FIG. 17 shows a specific example of each of the level conversion circuits 2702 and 2703 in FIG. 16. The circuit shown in FIG. 17 receives complementary signals i1 and i2 as input signals and converts the levels of the signals i1 and i2 to output a signal o1. FIG. 18 shows an embodiment of the level conversion circuit 2706 in FIG. 16. The circuit shown in FIG. 18 receives complementary signals i1 and i2 as input signals and converts the levels of the signals i1 and i2 to output a signal o1 in the same manner as in FIG. 17. It is a matter of course that, besides the I/O circuit shown in FIGS. 16 through 18, circuits according to various I/O interface standards such as 1.8V CMOS, 2.5V CMOS, 3.3V LVTTL, AGP, PCI, SSTL, HSTL, GTL, GTL+, SSTL, SSTL-2, LVDS, etc. may be used.

The chip in this embodiment has been described above on the assumption that two kinds of transistors different in gate oxide thickness exist in the chip. The gate portion of each of transistors thick in gate oxide thickness as represented by P2901 and N2902 in the drawings is expressed by a long box. The gate portion of each of transistors thin in gate oxide film thickness as represented by P2905 and N2906 in the drawings is expressed by a fine line. The transistors thick in gate oxide thickness are adapted for places where high-voltages are applied because the thick gate-oxide transistors have I/O power-supply-voltage tolerance. The transistors thin in gate oxide thickness are adapted for circuits operating with the core voltage because the thin transistors withstand the core voltage.

The respective transistors shown in this embodiment are shown as an example in which the transistors are selected as optimal kinds in accordance with the voltages applied to respective terminals of the transistors. Although the way of using such transistors is not specifically limited to the way described in this embodiment, it is apparent that, so long as the transistors withstand the voltages, the use of transistors thin in oxide film thickness makes the circuit performance be enhanced.

The effect of the present invention according to the first embodiment is as follows.

(1) In a chip provided with a power supply system having an I/O power supply and at least one core power supply, a power supply for the second circuit block CIR2 is provided after stabilization by down-converting the I/O power-supply voltage or by up-converting and then down-converting the I/O power-supply voltage. Hence, the second circuit block CIR2 can be operated normally even in the case where the core power-supply voltage is reduced. Although the aforementioned first embodiment has shown the case where a DRAM circuit is applied to the second circuit block CIR2, the low-voltage operating characteristic of the DRAM circuit is generally inferior to that of a logic circuit. That is, deterioration of speed of the DRAM circuit is acute in a low-voltage mode. The core power-supply voltage, however, can be reduced (the power-supply voltage for the first circuit block CIR1 can be reduced) regardless of the low-voltage operating characteristic of the DRAM circuit when the power supply for the DRAM circuit is used after stabilization by converting the I/O power-supply voltage in the condition that the core power supply as the power supply for the first circuit block CIR1 is separated from the power supply for the DRAM circuit as described in the first embodiment. Further, when a desired voltage is obtained by up-conversion, the up-conversion can be performed efficiently because up-converting the I/O voltage into a higher voltage can suppress the voltage-increasing ratio to a relatively small value compared with up-converting the core voltage into a lower voltage.

(2) The power supply used inside the DRAM circuit is generated from the I/O power supply. Hence, the core power supply has no influence on the operation of the DRAM circuit even in the case where the core power-supply voltage is changed. If the power supply used inside the DRAM circuit is generated from the core power supply, the power-supply voltage for the DRAM circuit changes in accordance with the change of the core power-supply voltage. If the power-supply voltage (core power-supply voltage) for the first circuit block CIR1 is changed in accordance with the operating frequency of the first circuit block CIR1 so that the first circuit block CIR1 is operated with power as low as possible, the DRAM circuit in the background-art configuration cannot follow the fluctuation of the power-supply voltage to thereby result in a high possibility of causing a malfunction of the DRAM circuit. In the first embodiment, however, the DRAM circuit does not malfunction because the core power-supply voltage can be changed freely in use.

(3) The power-supply voltage for the second circuit block CIR2 sensitive to the fluctuation of the power-supply voltage is provided through PWR1. Hence, the second circuit block CIR2 operates stably because PWR1 operates as a power-supply voltage stabilizing circuit. When, for example, a logic circuit operating with 0.5 V is used in the second circuit block CIR2, the operating speed of the logic circuit operating with 0.5 V varies widely in accordance with the fluctuation of the power-supply voltage unless the threshold of MOS constituting the logic circuit is selected to be considerably low. For example, an operating speed difference of not smaller than twice is generated between operating voltages of 0.4 V and 0.5 V. If the logic circuit is used in the configuration according to this embodiment, the logic circuit can be operated at a desired speed because 0.5 V can be provided stably.

(4) Moreover, in this embodiment, the output voltage of PWR1 is generated by a series regulator. If the output voltage is generated by a charge pump or by a switching regulator using L and C, there is a disadvantage that a long recovery time is required when the output voltage is reduced to a value lower than its original value due to a rush current. This is because feedback control acting on the switching regulator (power supply) is generally performed only with a switching frequency peculiar to the switching regulator. If the switching frequency is set to be higher, the problem can be solved but the power efficiency in voltage conversion is lowered. On the contrary, in the method according to this embodiment, the recovery time against the aforementioned voltage drop is very short. Hence, the same effect can be obtained as that with additional provision of a decoupling capacitor used for suppressing the fluctuation of the power-supply voltage.

Embodiment 2

In Embodiment 2, a modified example of the overall configuration of the semiconductor integrated circuit as a subject of the present invention shown in FIG. 1 as Embodiment 1 will be described.

Figure 19:
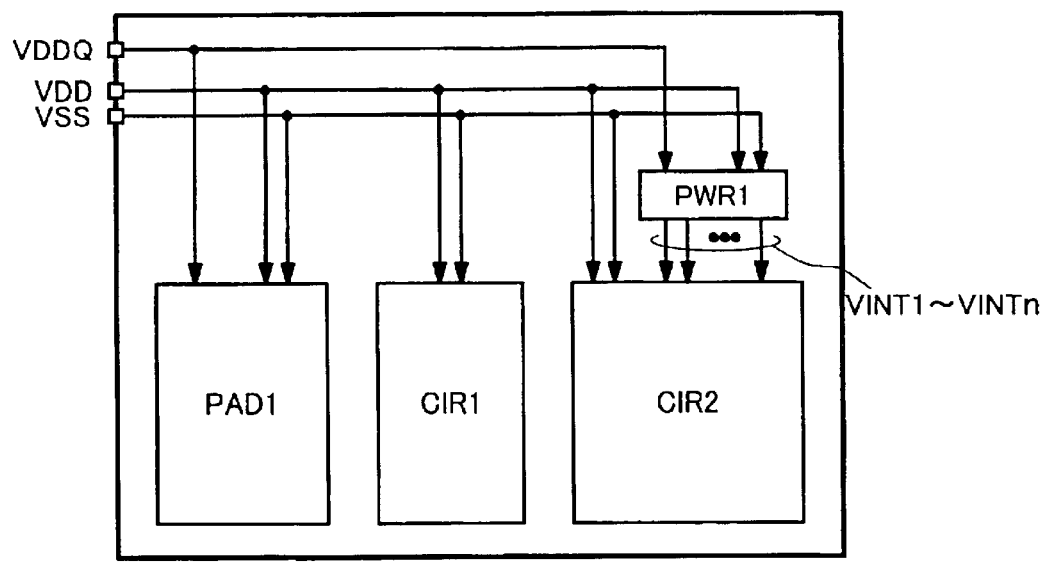
FIG. 19 is a diagram showing a modified example of the overall configuration in FIG. 1.

In comparison with FIG. 1, FIG. 19 shows an example in which the reference potential VSSQ for the I/O power supply and the reference potential VSS for the core power supply are shared with each other as common VSS so that the common VSS is received from a common power-supply pad and in which the reference potential power-supply wiring patterns in the inside are also shared with each other. When, for example, electric power consumed by the I/O circuit is so low that the peak current is small, it is unnecessary to separate the I/O power supply from the core power supply. In this case, the number of pins of the chip as a whole can be reduced when VSS is shared with VSSQ.

Figure 20:
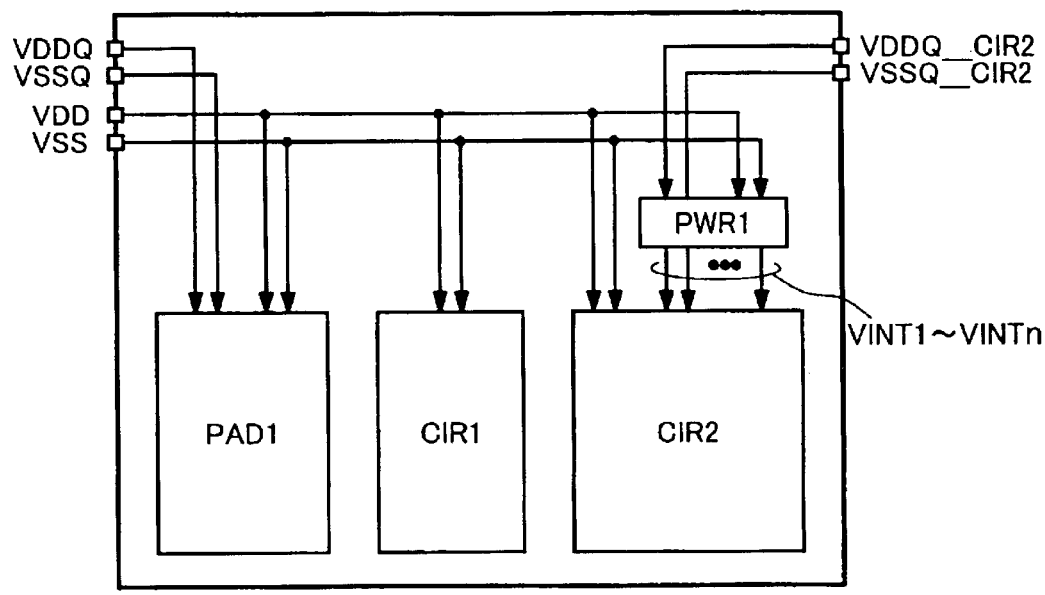
FIG. 20 is a diagram showing another modified example of the overall configuration in FIG. 1.

FIG. 20 shows an embodiment in the case where the pad and the power supply for VDDQ and VSSQ which are used in common to PAD1 and DWR1 in FIG. 1 are divided into the corresponding circuit blocks. In FIG. 20, VDDQ and VSSQ are used for PAD1 whereas VDDQ_CIR2 and VSSQ_CIR2 are used for PWR1. Incidentally, VDDQ and VDDQ_CIR2 are generally electrically short-circuited on a pin outside the silicon chip or on a printed-circuit board, and VSSQ and VSSQ_CIR2 are also electrically short-circuited. Generally, large noise is superposed on the power supply for the I/O circuit because the I/O circuit drives a large capacitive load outside the chip. Therefore, the power supply for the I/O circuit should be separated from any other power supply to prevent such large noise from entering the other power supply. In FIG. 20, the power-supply noise generated in PAD1 can be prevented from entering PWR1.

Figure 21:
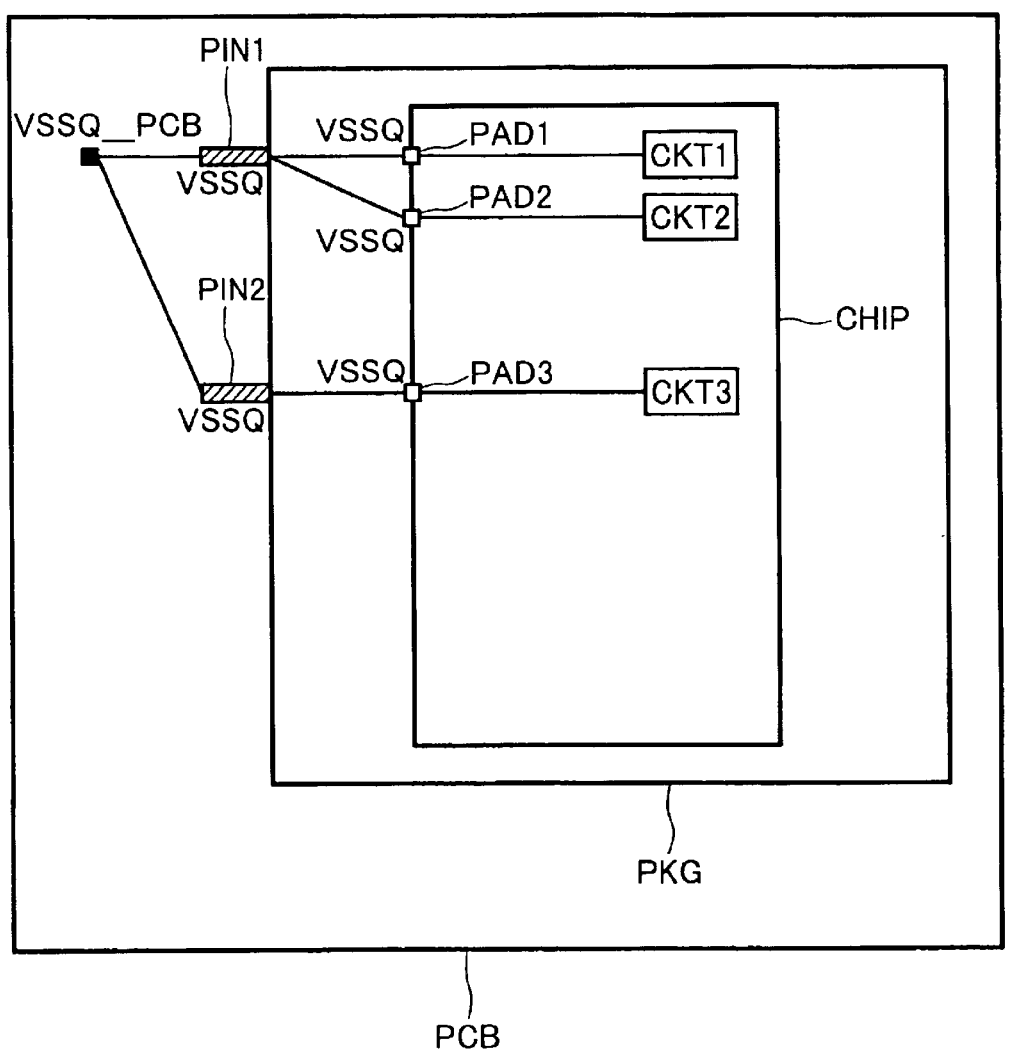
FIG. 21 is a diagram showing a package and electrodes for the semiconductor device in FIG. 1.

FIG. 21 shows an example of the way of arranging terminals of a package sealing a semiconductor integrated circuit and power-supply pads of the semiconductor chip with the same external power-supply voltages provided. That is, the quantity of the current allowed to flow in one pad is generally limited because of a bonding wire, a junction between the bonding wire and the pad, electromigration, etc. Therefore, a plurality of pads are generally prepared for a power supply required to have a large current flow. Although the embodiment in FIG. 1, etc., has shown the case where one pad is provided for each signal or each power supply except the pad having different connection destinations, that is, only one pad is provided for VDDQ and only one pad is provided for VDD, it is a matter of course that a plurality of pads may be provided for each signal or each power supply. Some chip has a form in which different pads equal in potential may be connected outside the silicon chip so that the pads are shared with each other as a pin of a package when the silicon chip is sealed in the package. It is a matter of course that also such a form of the chip is included in the present invention.

FIG. 21 will be described below specifically. CHIP is a silicon chip; PKG, a package; and PCB, a printed-circuit board. CKT1, CKT2 and CKT3 are circuit blocks respectively. FIG. 21 only shows each ground potential for each corresponding circuit block. PAD1, PAD2 and PAD3 are bonding pads connected to the ground potentials of CKT1, CKT2 and CKT3 respectively and supplied with VSSQ potential. PAD1 and PAD2 are connected to a pin PIN1 of the package by bonding wire while PAD3 is connected to PIN2 by bonding wire. On the printed-circuit board, PIN1 and PIN2 are further electrically connected to a node VSSQ_PCB for supplying the VSSQ potential by a wiring pattern generally printed on the printed-circuit board.

Dividing power-supply pads and package pins for every circuit block in the aforementioned manner can prevent noise from being mixing from one circuit into another circuit through the power-supply line. When, for example, CTK1 is an I/O circuit in which large noise is produced, noise enters the ground potential of CKT2 through PIN1 and also enters the ground potential of CKT3 through VSSQ_PCB. Hence, the amount of noise entering CKT3 can be reduced compared with the amount of noise entering CKT2.

A filter may be inserted into a power-supply line. For example, a filter using inductance or decoupling capacitance such as a filter of ferrite beads may be inserted into a power supply line, for example, of a power supply for a circuit strongly affected by noise. If CKT3 in the embodiment shown in FIG. 21 is a circuit easily affected by noise, it is effective to insert a filter in between PIN2 and VSSQ_PCB. If CIR2 in the embodiment shown in FIG. 20 is a DRAM circuit, it is effective to supply VDDQ_CIR2 through a filter.

Figure 22:
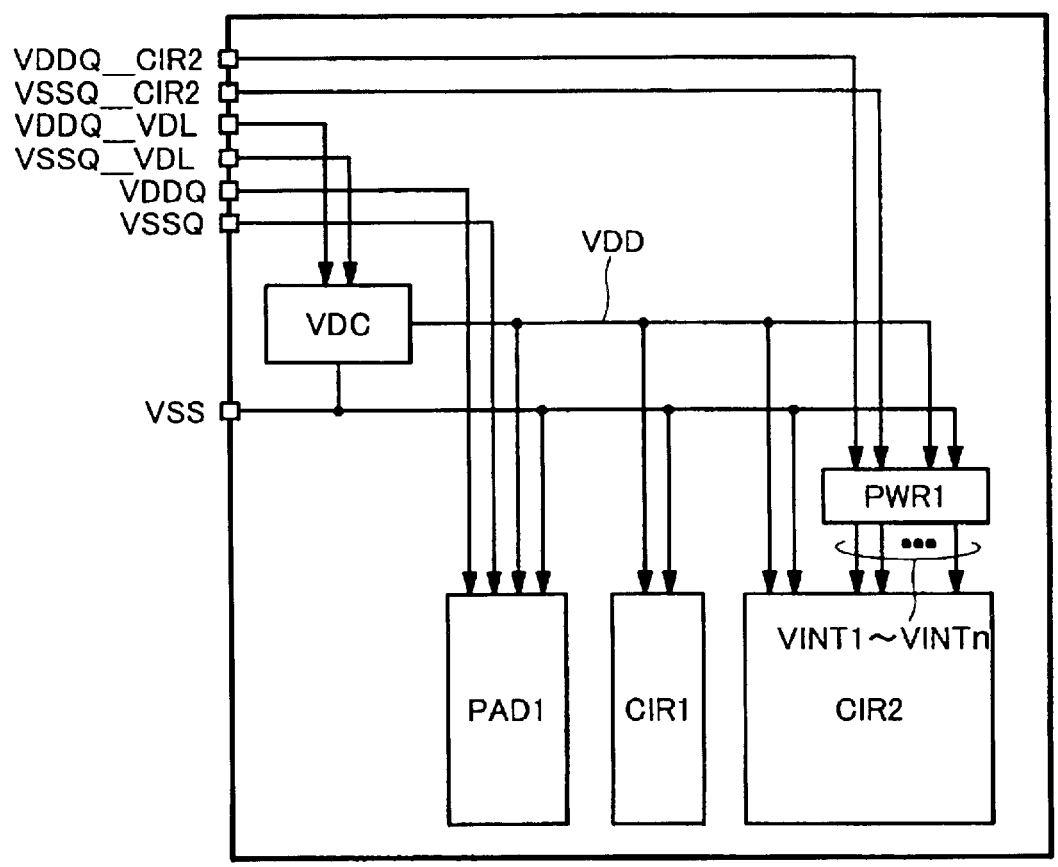
FIG. 22 is a diagram showing a further modified example of the overall configuration in FIG. 1.

FIG. 22 shows the case where the power-supply voltage supplied from the outside of the chip is limited to one kind of voltage VDDQ (for example, 3.3 V). In FIG. 22, pads for receiving one I/O voltage (for example, 3.3 V) in the same manner as in FIG. 20 are divided into a pair of VDDQ_CIR2 and VSSQ_CIR2, a pair of VDDQ_VDL and VSSQ_VDL and a pair of VDDQ and VSSQ by PWR1, VDL and PAD1. This is because the effect shown in FIG. 21 is expected. Although FIG. 22 shows the case where VSSQ_VDL and VSS are supplied to VDC, the present invention may be applied also to the case where either VSSQ_VDL or VSS may be used or both may be used. When VSS is used at least as the ground potential of a circuit for detecting the output voltage VDD of VDC and is used as the ground potential of a reference voltage circuit for the detecting circuit, the voltage level of VDD can be set to be a value based on the reference voltage so that each circuit block is less affected by noise produced on VSSQ.

Figure 23:
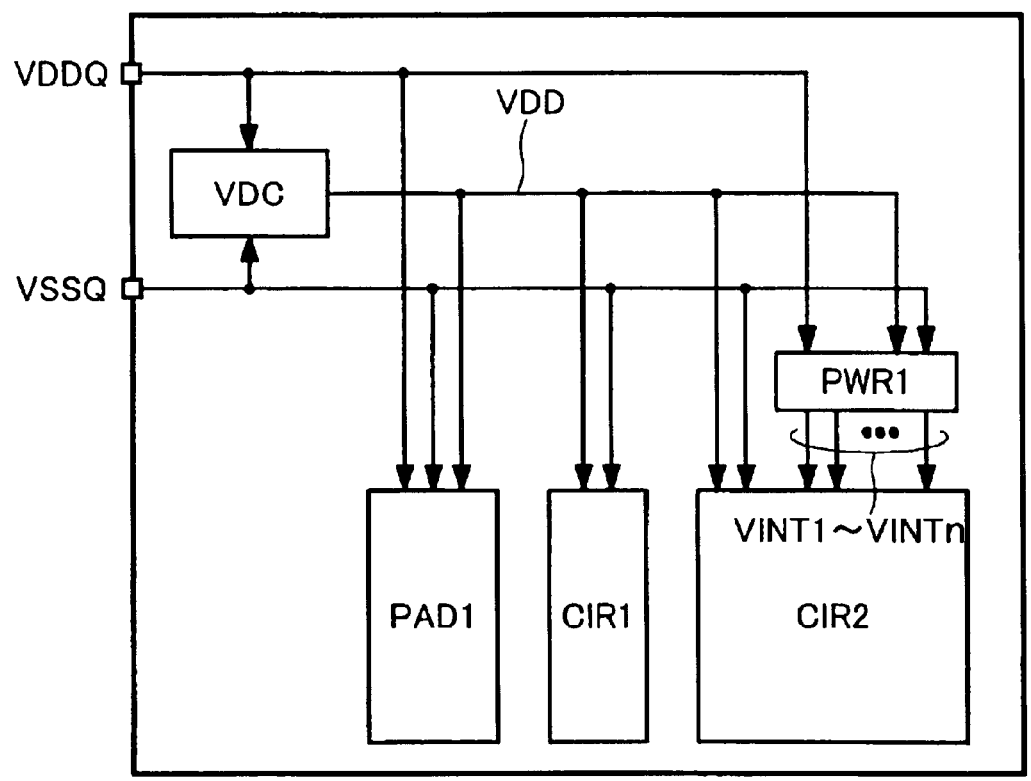
FIG. 23 is a diagram showing a further modified example of the overall configuration in FIG. 1.

FIG. 23 shows an extreme example which is the embodiment in the case where all ground potentials VSSQ and VSS in FIG. 22 are supplied from a common pad. The same effect as in FIG. 22 can be obtained except that noise produced on VSSQ by an I/O circuit affects VSS directly.

Figure 32:
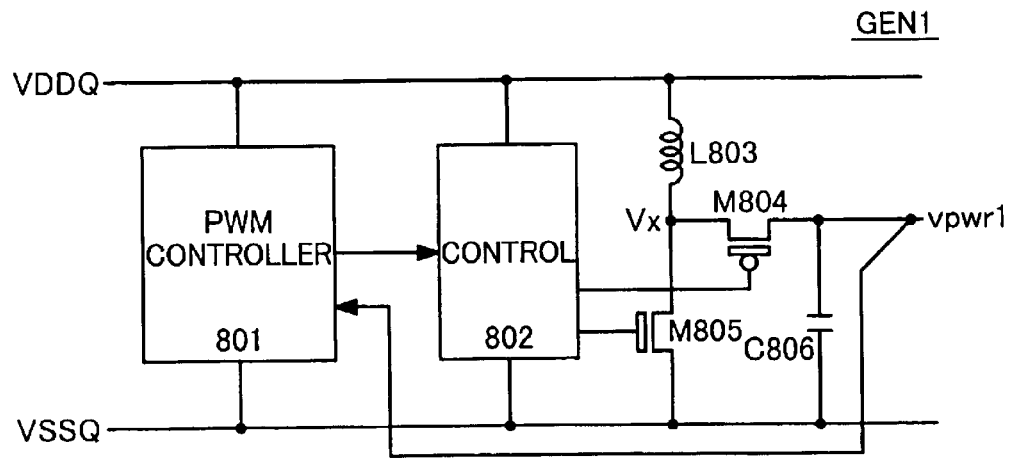
FIG. 32 is a diagram showing a further example of the voltage up-converter GEN1.
Figure 32:
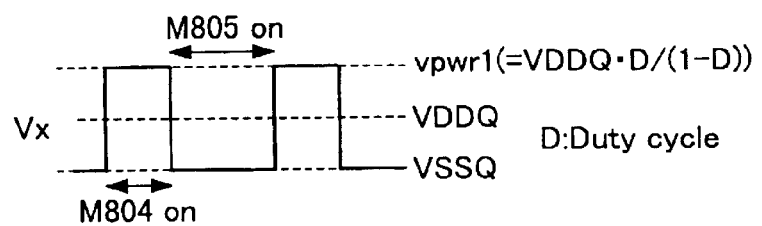

In FIGS. 22 and 23, the configuration of VDC is not specifically limited. VDC may be constituted by a switching regulator which will be described later with reference to FIG. 32. Although FIG. 32 shows the case where a DC-DC converter is operated as a voltage up-converter, it is a matter of course that the configuration of a CMOS buck type is used when voltage down-conversion is required to be applied to this embodiment. Although a charge pump system may be used, the use of a switching regulator system makes voltage conversion efficiency increase when a great deal of current flows in VDD.

Although description or explanation about the embodiment with reference to the drawings has been made under the condition that circuit members are formed on one chip, it is a matter of course that the circuit members may be partially formed on another chip or provided as discrete members outside the chip.

The present invention can be applied also to the case where circuit blocks such as CIR1 and CIR2 in FIG. 1 are not formed on one chip. In this case, the package is provided as a multi-chip package (MCP) in which a plurality of chips are packed. (The terminology "MCP" used herein also includes a stacked chip size package (stacked CSP) in which a plurality of chips are laminated and packed.)

In this case, for example, in the embodiment shown in FIG. 1, CIR2 and PWR1 are integrated on one chip whereas CIR1 and PAD are integrated on another chip. In this case, of course, the reference numeral 101 designates not a pad but a pin of MCP in which two chips are packed. Apparently, the effect of the present invention can be obtained also in the case where the present invention is applied to a package containing a plurality of chips therein as described above.

If a chip mounted with CIR2 is separated from any other chip, for example, in the case where CIR2 is mounted with a DRAM circuit, there is an effect that the burden imposed on a process is lightened. That is, the chip mounted with CIR2 can be produced by a DRAM process whereas any other chip can be produced by a logic process. On the contrary, if all members are to be integrated on one chip, the chip needs to be produced by a DRAM-logic mixture process. Further, a chip having specifications in common with a general-purpose DRAM as a single unit in most respects can be used as the chip mounted with CIR2. In this case, if CIR2 does not require a large capacity, a chip rejected as a defective chip in terms of a general-purpose chip as a single unit can be reused as the CIR2-mounted chip by limiting the capacity of CIR2.

Although wiring patterns for the power-supply system according to the aforementioned embodiment have been mainly described or explained in the drawings for the sake of simplification, no requirement is imposed on the forms of signal lines. When a lot of power supplies are provided inside the chip, there are generally a lot of signals different in amplitude. When the level conversion circuit shown in FIG. 17 or 18 is used as an interface circuit for these signals, level conversion can be performed at a high speed without generating any feedthrough current.

Embodiment 3

A specific example and a modified example of arrangement on a chip in the overall configuration of the semiconductor integrated circuit as a subject of the present invention described in Embodiments 1 and 2 will be described below as Embodiment 3. If GEN1, REF1 and REG1 are arranged in the following portions in a chip, various effects can be obtained.

Figure 24:
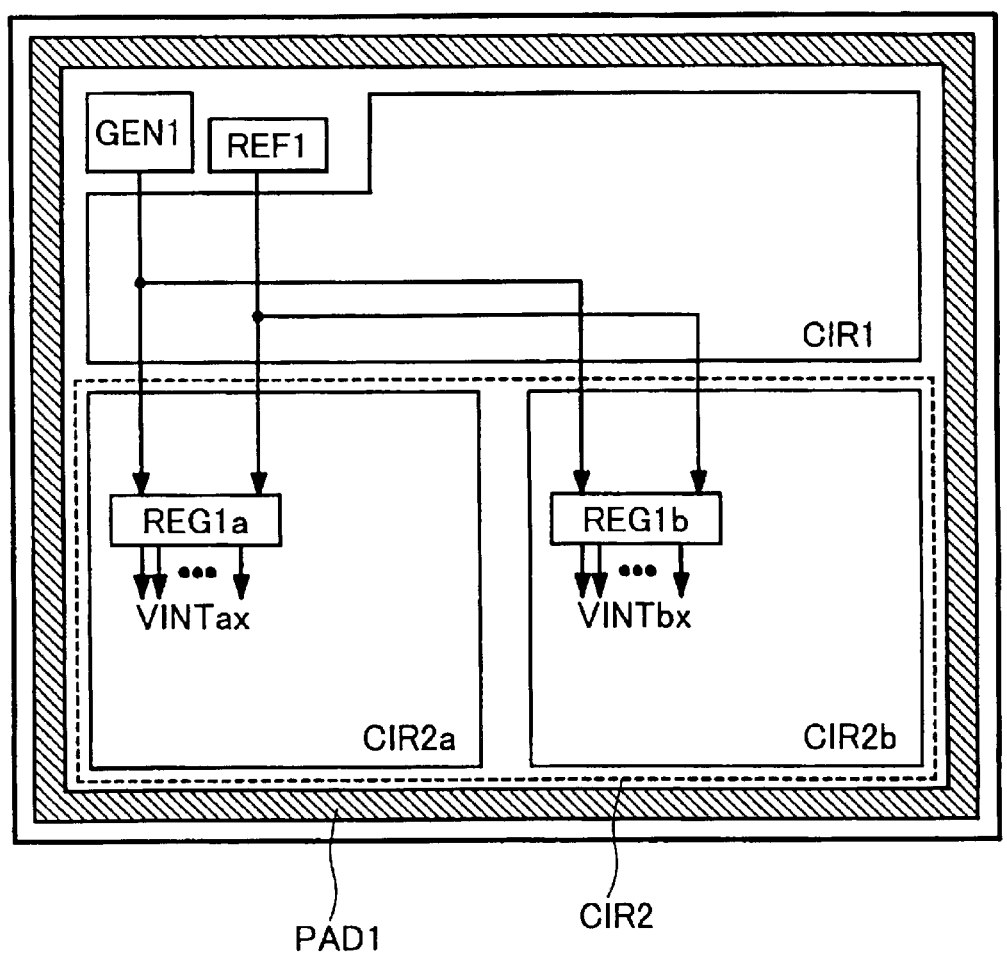
FIG. 24 is a diagram showing an embodiment of arrangement on the chip.

FIG. 24 shows a physical layout image of a chip according to the present invention. PAD1 is a region in which pads for signal interface to the outside are arranged. The location of PAD1 is not specifically limited but, in this embodiment, PAD1 is located in the periphery of the chip. One GEN1 and one REF1 are formed on the chip and located in the left upper portion of the chip. This embodiment illustrates the case where the second internal circuit CIR2 is further divided into two parts, CIR2a and CIR2b. Typically, that which is equivalent to this case is the case where CIR2 provided as a DRAM circuit is divided into a plurality of memory banks. In this embodiment, two regulators each equivalent to REG1 are formed on the chip and designated by REG1a and REG1b respectively. REG1a outputs VINTax whereas REG1b outputs VINTbx. REG1a and REG1b are arranged near the circuits CIR1 and CIR2 respectively so that the circuits CIR1 and CIR2 can use the outputs of REG1a and REG1b respectively.

The regulators are arranged near the circuits which use the outputs of the regulators in the afore-mentioned manner. In this way, the parasitic resistance of wiring patterns used for connecting the regulators to the circuits using the outputs of the regulators can be reduced. Hence, a voltage drop due to a large current flowing in each wiring pattern can be suppressed. Generally, the distance between each regulator and GEN1 becomes longer but the amount of the current flowing between the regulator and GEN1 becomes smaller because a high voltage is applied therebetween. Hence, the voltage drop can be suppressed even if the distance between the regulator and GEN1 becomes long and the parasitic resistance of the wiring pattern becomes higher. Moreover, the noise removal ratio of the power-supply voltage VPWR1 input to the regulator is kept high by the regulator. Hence, the output of the regulator is little affected by noise due to the voltage drop between the regulator and GEN1.

In FIG. 24, one reference voltage generating circuit REF1 is disposed in the chip so as to be far from the regulators. The output of the reference voltage generating circuit REF1 is kept at a constant voltage with respect to the ground potential of the reference voltage generating circuit. The ground potential, however, always changes in accordance with noise, or the like, so that the state of the change thereof generally varies in accordance with the position in the chip. In the embodiment shown in FIG. 24, for example, the ground potential of REF1 may be different from that of REG1a. Moreover, the difference between the ground potentials varies in accordance with the operating state of the chip. Hence, in the embodiment shown in FIG. 24, the reference voltage VREF1 received by each regulator always varies in accordance with noise viewed from the ground potential of the regulator, so that the output of the regulator varies correspondingly.

Figure 25:
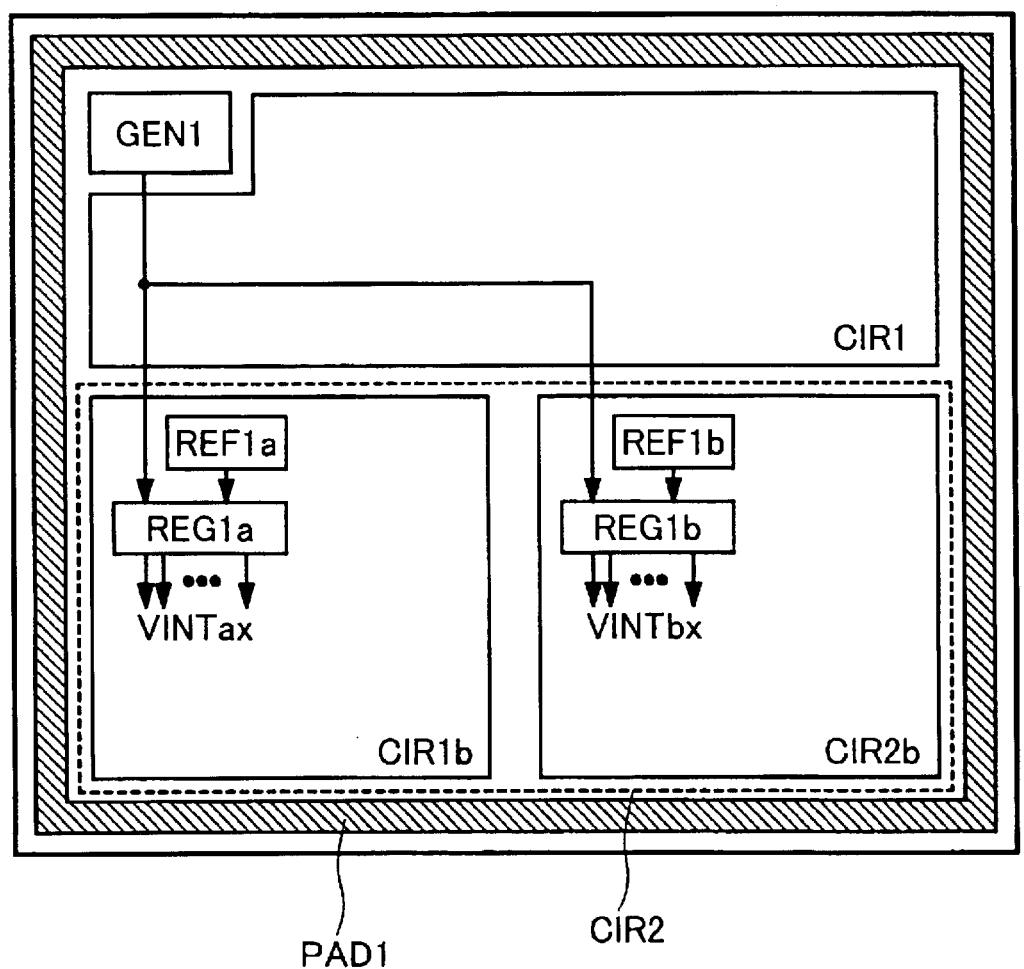
FIG. 25 is a diagram showing another embodiment of arrangement on the chip.

On the contrary, FIG. 25 shows an embodiment in which reference voltage generating circuits REF1a and REF1b are provided for regulators REG1a and REG1b respectively and arranged near the regulators respectively. In this embodiment, there is an effect that the potential difference between the ground potentials becomes smaller because the reference voltage generating circuits REF1a and REF1b are near the regulators REG1a and REG1b respectively. That is, though it is a matter of course that noise is interposed on the ground potentials also in this case, noise on the ground potential of each regulator and noise on the ground potential of a corresponding reference voltage generating circuit are produced as in-phase noise because of short distance between the regulator and the circuit. Hence, the output potential of the regulator can be obtained as an accurate expected voltage on the basis of the ground potential of the regulator. Although FIG. 25 shows an example in which regulators and reference voltage generating circuits are arranged ideally as described above, preparation of a number of reference voltage generating circuits corresponding to the number of regulators causes increase in the area of the chip.

Figure 26:
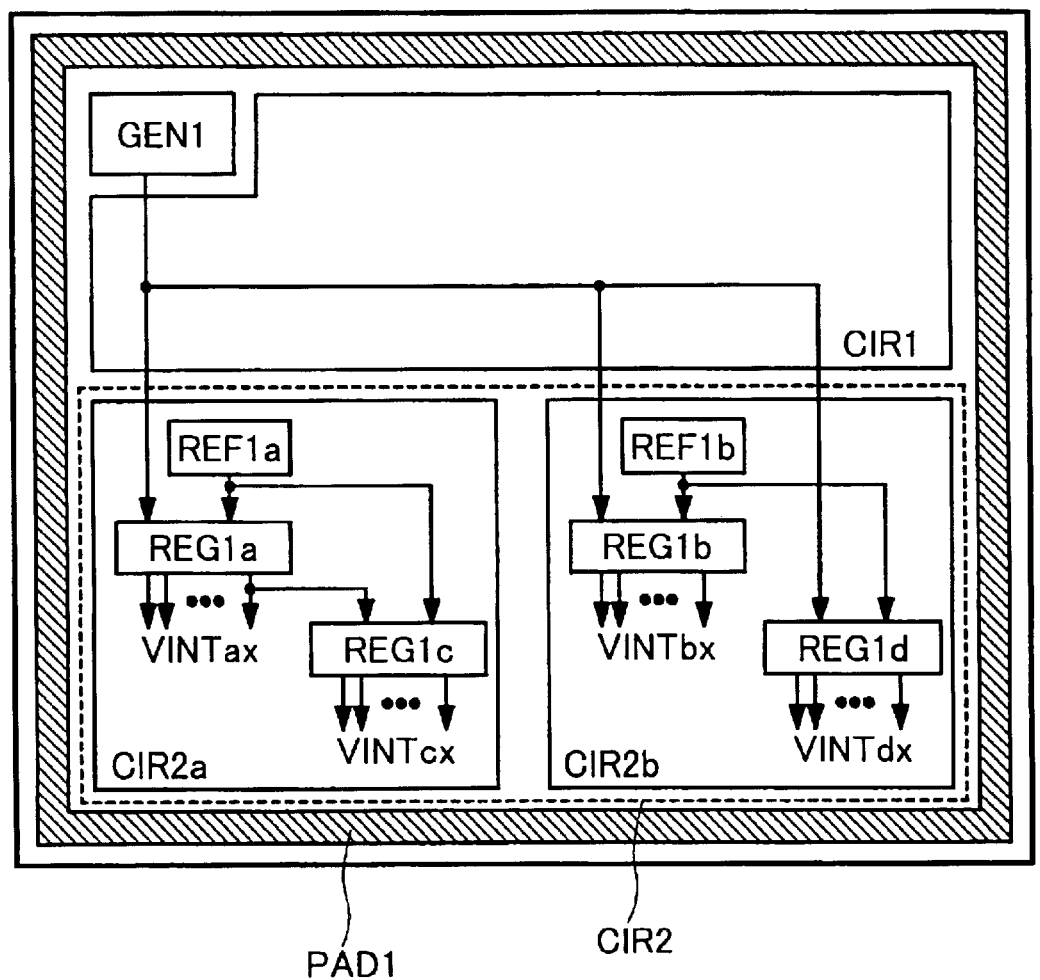
FIG. 26 is a diagram showing a further embodiment of arrangement on the chip.

FIG. 26 shows an example of arrangement of regulators and reference voltage generating circuits to make use of the advantages of FIGS. 24 and 25. Each of the regulators shown in FIG. 24 is preferably arranged near a circuit which uses the output of the regulator. On the other hand, as shown in FIG. 25, each of the reference voltage generating circuits is preferably arranged near a corresponding regulator. In FIG. 26, the aforementioned requirements are satisfied by preparing a plurality of regulators (a combination of REG1a and REG1c or a combination of REG1b and REG1d) for one reference voltage generating circuit (REF1a or REF1b). Moreover, in FIG. 26, the input of REG1c is extracted from the output of REG1a because voltage conversion efficiency becomes better when the input voltage of each regulator is near the output voltage of the regulator.

Other than the above arrangement method, various arrangement methods may be conceived. The method of arrangement of regulators and reference voltage generating circuits is however not specifically limited, so long as regulators and reference voltage generating circuits are arranged to reduce the influence of power-supply noise, or the like, on the output voltages of the regulators, improve the voltage conversion efficiency of the regulators and improve the area efficiency thereof.

Embodiment 4

A modified example of the internal power-supply voltage generating circuit PWR1 shown in Embodiments 1 and 2 and a preferable modified example of individual circuits (such as a voltage up-converter and a voltage limiter) used in PWR1 will be described below as Embodiment 4.

Figure 27:
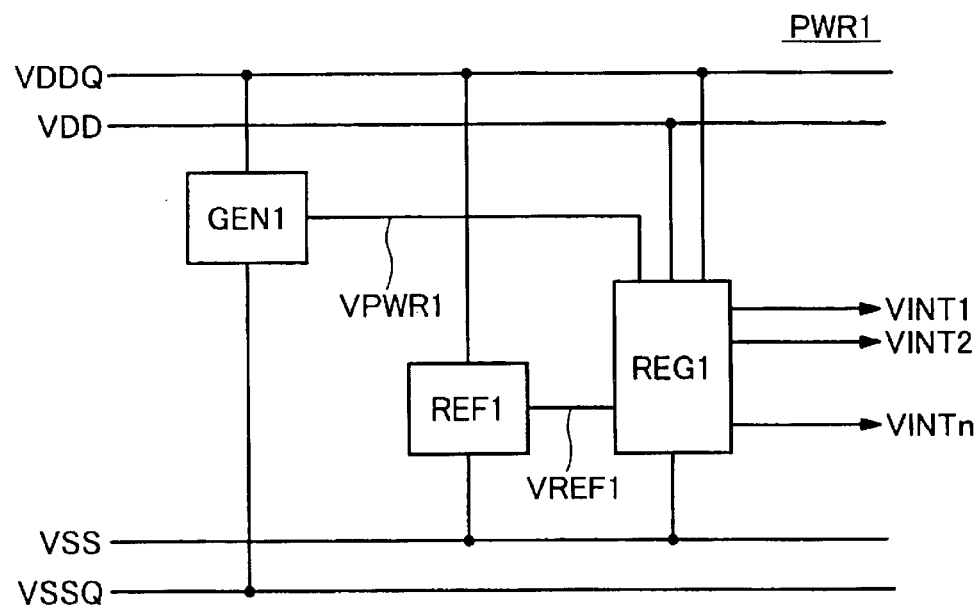
FIG. 27 is a diagram showing a modified example of the internal voltage generating circuit PWR1.

FIG. 27 shows a generalized example of the circuit shown in FIG. 2. In FIG. 27, the voltage conversion circuit REG1 is expressed in a more general concept. Specifically, as shown in FIG. 2, REG1 includes a plurality of voltage down-converters (voltage limiters and half voltage generating circuits). The voltage down-converters generate internal voltages VINT1 to VINTn by reducing the external power-supply voltages VDDQ and VDD and the internal power-supply voltage VPWR1. Although FIG. 2 shows the case where VDD is not used for the operation of REG1, FIG. 27 shows, as a generalized example, the case where VDD is supplied to REG1 for the purpose of indicating the fact that VDD can be also used. If not necessary, VDD can be ignored as shown in the specific example in FIG. 2.

Figure 28:
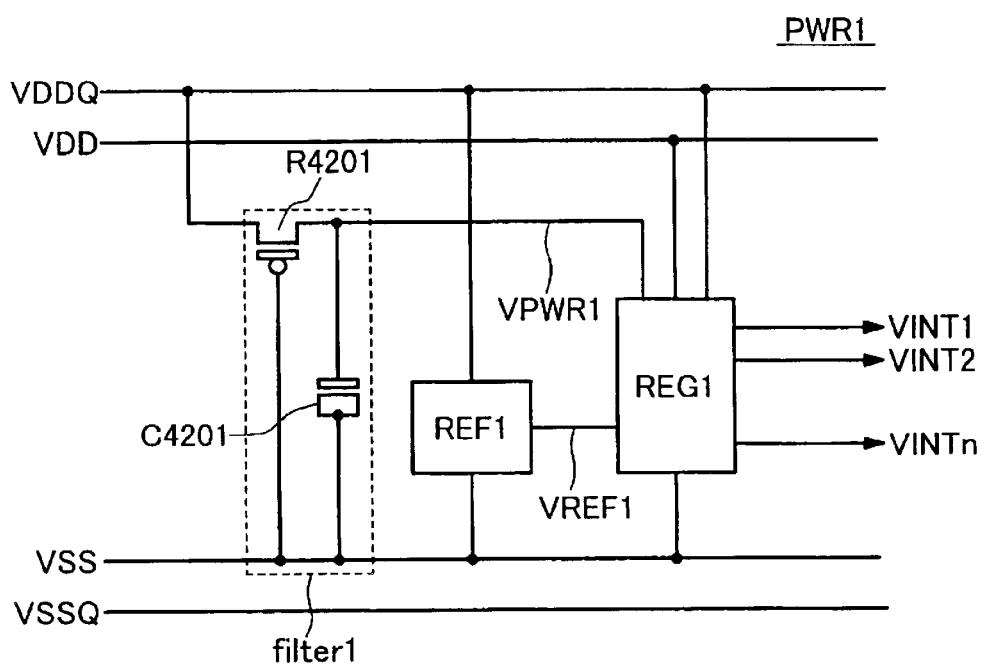
FIG. 28 is a diagram showing another modified example of the internal voltage generating circuit PWR1.

FIG. 28 shows an embodiment in the case where GEN1 in FIG. 27 is omitted so that VPWR1 in FIG. 27 is obtained from VDDQ through R4201. When the I/O voltage is sufficiently high in comparison with voltages output as VINT1 to VINTn, it is unnecessary to increase the potential of VDDQ. In this case, this configuration can be used. As another feature of this embodiment, VDDQ is supplied to REG1 through a power-supply filter circuit "filter1". If not necessary, the power-supply filter can be omitted. The "filter1" is constituted by a capacitor C4201 and a resistor R4201. The capacitor C4201 is formed of an MOS transistor, and in the same manner, the resistor R4201 is formed of an MOS transistor. Although the resistor R4201 makes the impedance of VPWR1 high, the resistor R4201 can prevent noise on VDDQ from propagating to VPWR1. Further, the addition of the capacitor C4201 to the input side makes AC impedance low to thereby prevent the AC impedance from having influence on the output of REG1.

When a rush current flows in the output of REG1, the capacitor on the input side of REG1 supplies electric charges due to the rush current to the output of REG1 so that a ripple voltage can be prevented from occurring in the output voltage of REG1. Because potential drop is generated to a certain degree on the input side of REG1 at this time, it is, of course, necessary to keep the input voltage to an extent that REG1 can generate an expected output voltage normally in spite of the potential drop. Therefore, the capacitance of the capacitor may be designed to be large to a certain degree or the input voltage VPWR1 of REG1 may be designed to be high.

The condition for the above description will be expressed below in formula. The quantity of the voltage effect of VPWR1 can be calculated by the formula $\Delta V = Q/C$ in which C is the capacitance of the capacitor C4201, $\Delta V$ is the quantity of the voltage effect of VPWR1, and Q is the quantity of electric charges due to the rush current. Hence, design is preferably made to satisfy the relation Vnom–Vmin>$\Delta V$ in which Vmin is the lowest voltage of VDWR1 necessary for REG1 to generate an expected output voltage normally, and Vnom is the non-load voltage of VPWR1. That is, the relation (Vnom–Vmin)C>Q is required. It is apparent that the relation can be achieved when Vnom is set to be high or when C is set to be large.

Figure 29:
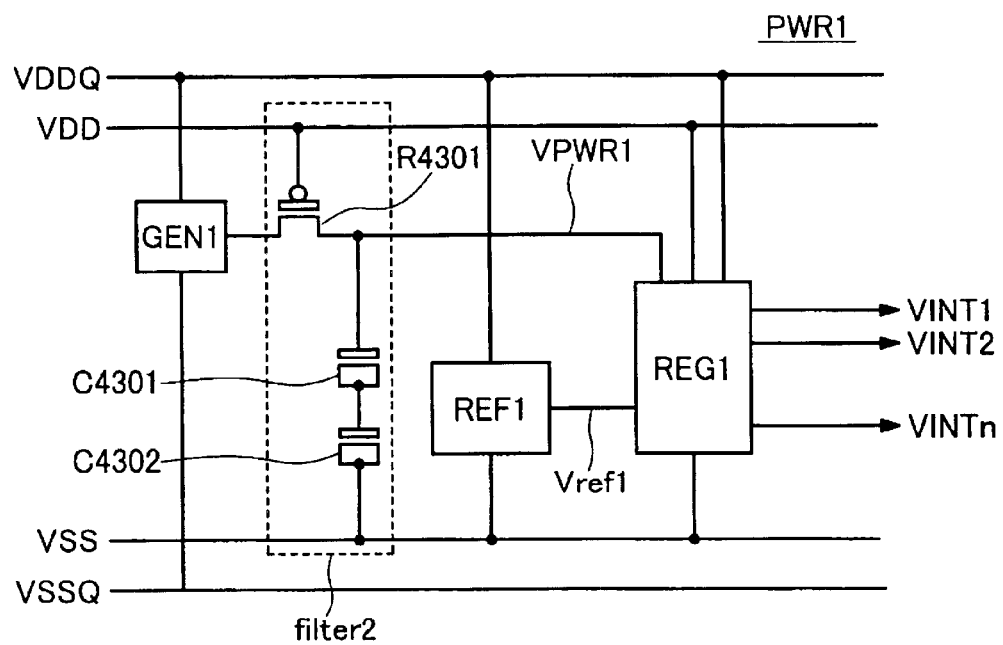
FIG. 29 is a diagram showing a further modified example of the internal voltage generating circuit PWR1.

FIG. 29 shows a modified example to apply the power-supply filter shown in FIG. 28 to FIG. 27. In. FIG. 29, the output of the voltage up-converter GEN1 is supplied to REG1 through a power-supply filter "filter2". R4301 is a resistor. C4301 and C4302 are capacitors respectively. Because of the withstanding voltage of an MOS transistor, the way of connecting the resistor and capacitors in FIG. 29 is different from that in FIG. 28.

Figure 30:
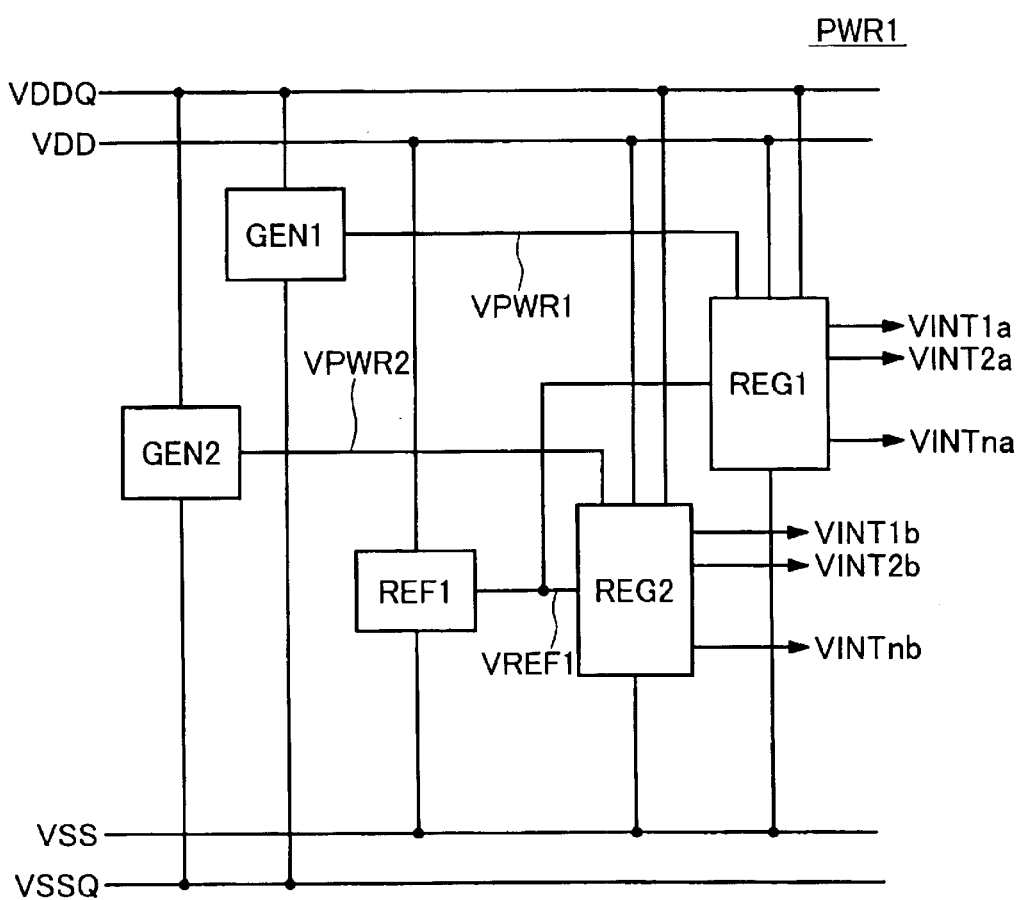
FIG. 30 is a diagram showing a further modified example of the internal voltage generating circuit PWR1.

FIG. 30 shows an embodiment in the case where two voltage up-converters GEN1 and two regulators REG1 are provided. Generally, in the case where a series pass regulator system (hereinafter referred to also as "series regulator") is used as a regulator circuit, if the potential difference between the input and output voltages of the regulator is large, the conversion efficiency of the regulator is lowered. In this embodiment, therefore, voltages VINT1 to VINTn to be obtained finally are divided into two groups, namely, a relatively high voltage group VINT1$a$ to VINTn$a$ and a relatively low voltage group VINT1$b$ to VINTn$b$.

Further, VPWR1 higher than the relatively high voltage group VINT1$a$ to VINTn$a$ is generated by GEN1 whereas VPWR2 higher than the relatively low voltage group VINT1$b$ to VINTn$b$ is generated by GEN2. Then, REG1 generates the relatively high voltage group VINT1$a$ to VINTn$a$ from VPWR1 whereas REG2 generates the relatively low voltage group VINT1$b$ to VINTn$b$ from VPWR2. In this manner, the potential difference between the input and output voltages of each regulator is reduced as sufficiently as possible, so that the voltage conversion efficiency of the regulator can be enhanced.

Other than the embodiments of PWR1 shown in FIGS. 27 through 30, various configuration methods may be conceived. For example, the ground potential of the voltage up-converter GEN1 may be connected to VSS though the aforementioned embodiments have shown the case where the ground potential of GEN1 is connected to VSSQ. In a chip to which a ground potential for I/O circuits and a ground potential for core circuits operating with a voltage lower than the I/O circuits are supplied from separate pads respectively, the configuration method is not specifically limited so long as regulators using, as their ground potential, the ground potential (VSS) of the circuit CIR2 using the power-supply voltages VINT1 to VINTn inside the chip can generate the power-supply voltages VINT1 to VINTn stably from the I/O voltage or by increasing or reducing the I/O voltage.

FIGS. 31 and 32 show other examples of the voltage up-converter GEN1. FIG. 31 shows a charge pump voltage up-converter for generating a voltage three times as high as VDDQ to VPWR1. The voltage up-converter shown in FIG. 31 is different from that shown in FIG. 3 in the number of pumping steps. The voltage up-converter shown in FIG. 31 can generate a boosted voltage larger than that obtained in FIG. 3. Incidentally, OSC and SEN are not shown in FIG. 31 but the configuration thereof is the same as in FIG. 3.

FIG. 32 shows an example in which a DC-DC converter using a so-called CMOS boost switching regulator system is used as GEN1. In FIG. 32, L803 is an inductor; M804 and M805, switching transistors respectively; and C806, a smoothing capacitor. The period in which the switching transistors M804 and M805 are turned on and off respectively and the period in which M804 and M805 are turned off and on respectively are controlled as shown in a waveform chart in FIG. 32, that is, the duty cycle is controlled to thereby control the output voltage of VPWR1. The on/off control of the switching transistors is performed while circuits 802 and 801 monitor the voltage of VPWR1. The inductor L803 may be provided inside the chip or may be provided outside the chip. This circuit is characterized in that the voltage can be converted with high power efficiency when the output current is larger in comparison with the charge pump voltage up-conversion system. Hence, the voltage up-converter of this type is preferably used when a large current flows in VPWR1.

Figure 33:
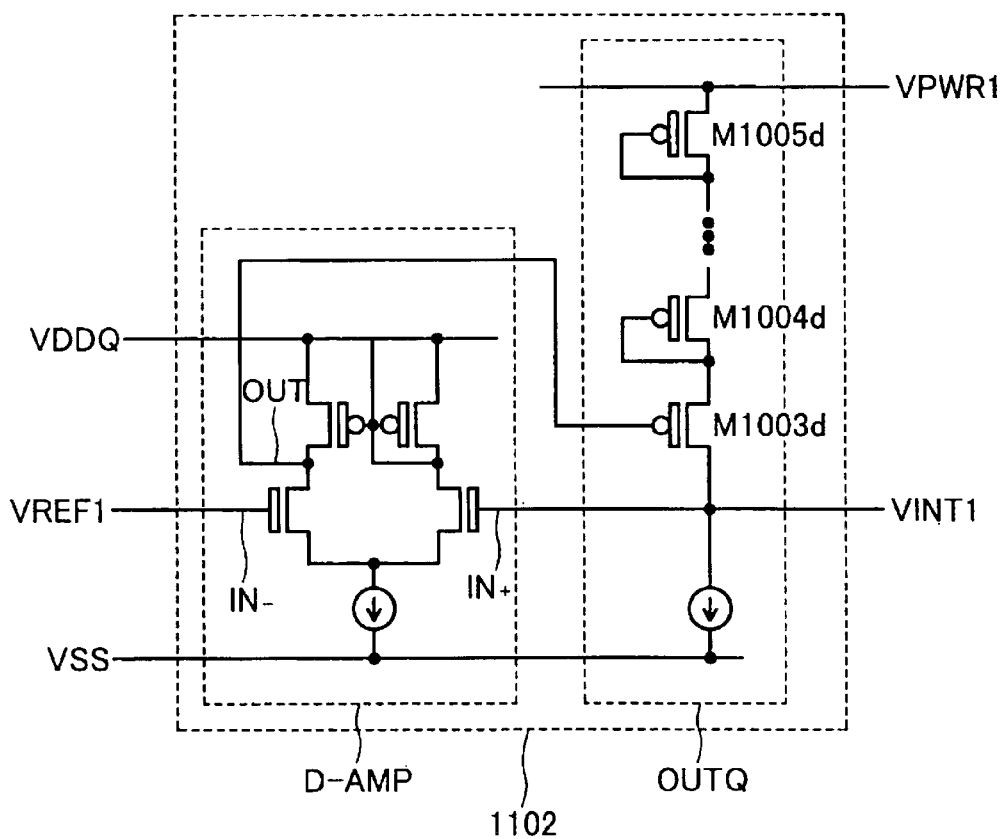
FIG. 33 is a diagram showing another example of the voltage down-converter VLM1.

A modified example of the voltage limiter circuit contained in the voltage conversion circuit REG1 will be described below with reference to FIG. 33. Although FIG. 33 shows only the internal voltage output buffer 1102 in the circuit shown in FIG. 5, the circuit 1101 for level conversion of the reference voltage is also configured in the same manner as the circuit 1102. The important point in connection of the voltage up-converter GEN1 and the voltage limiter circuit is that the ground potential thereof is connected to a line of the same potential (equivalent to VSS in FIG. 33) as the ground potential of a circuit using the output of GEN1. The way of arranging the positive power-supply potential is not specifically limited. An MOS transistor is, however, limited in potential difference allowed to be applied between respective terminals of the MOS transistor because of the withstanding voltage of the oxide film of the MOS transistor, or the like. Hence, there is a possibility that the voltage of VPRW1 may exceed the withstanding voltage of the MOS transistor if the voltage of the VPWR1 is too high. In such a case, the method shown in FIG. 33 is rather preferred than the power supply method shown in FIG. 5. In FIG. 33, the positive power-supply voltage of an operational amplifier D-AMP is connected to VDDQ which is the power-supply voltage for the I/O circuit. In this case, the same MOS transistor used in the I/O circuit is preferably used as an MOS transistor used in the operational amplifier.

In this case, the remaining problem concerning withstanding voltage is an MOS transistor M1003*d* in OUTQ which outputs VINT1. Assume first the case where the source of the MOS transistor M1003*d* is directly connected to VPWR1 in the same manner as in FIG. 5. Assume then that a voltage of 5 V is given to VPWR1 to make an attempt to output a voltage of 3 V at VINT1 when the withstanding voltage of the MOS transistor M1003*d* is 3.3 V. Then, in order to set the potential difference between the gate and source of M1003*d* to be 3.3 V or lower and to set the potential difference between the gate and drain of M1003*d* to be 3.3 V or lower, it is to be understood that such a condition (hereinafter referred to as "voltage condition 1") that a voltage of 1.7 V or higher is applied to the gate terminal of M1003*d* is required to be satisfied. The circuit shown in FIG. 33 can satisfy the voltage condition 1 if an MOS transistor with a sufficiently large gate width is selected as M1003*d* so that a load current connected with VINT1 can be driven with power enough to spare.

Conversely, in the case where the voltage condition 1 cannot be satisfied (that is, in the case where the voltage of VPWR1 is considerably higher than a voltage to be output at VINT1), the voltage of VPWR1 may be reduced by level shifting by the diode-connected transistors M1004*d* to M1005*d* as shown in FIG. 33 without directly connecting the source of M1003*d* to VPWR1 so that the reduced voltage is supplied to the source terminal of M1003*d*.

Although the example in FIG. 33 has shown the case where PMOS is used for each of the transistors M1003*d* to M1005*d*, the present invention may be applied also to the case where NMOS is used for the transistors M1003*d* and M1005*d*. In this case, it is necessary that the connection of IN− and IN+ of D-AMP shown in FIG. 33 are revered to each other but there is an effect that oscillation can be prevented because phase rotation is suppressed. Moreover, with respect to withstanding voltage, the use of NMOS is advantageous to the use of PMOS because the gate-source voltage or the gate-drain voltage of the former can be reduced.

Figure 34:
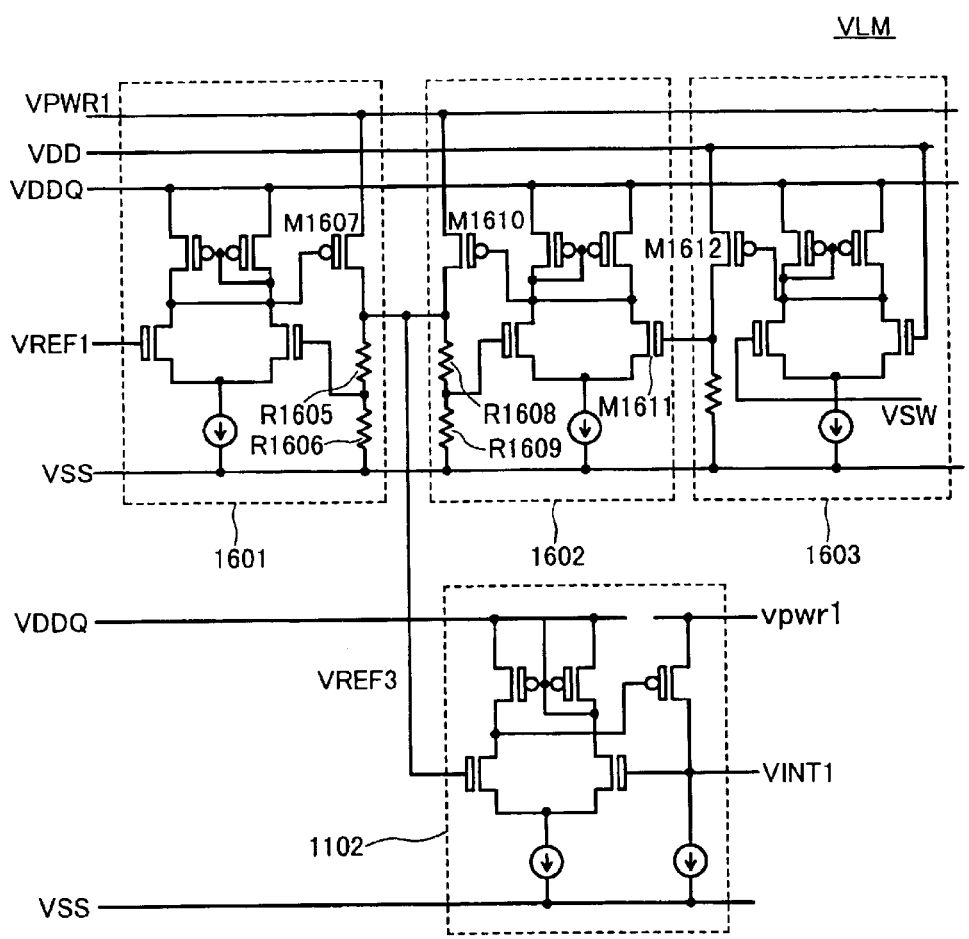
FIG. 34 is a diagram showing a further example of the voltage down-converter VLM1.

FIG. 34 shows an embodiment to enable an aging test (referred to also as "acceleration test" or "burn-in test") as a modified example of the voltage limiter shown in FIG. 5. The "aging test" ("acceleration test" or "burn-in test") used herein means a test for extracting Initial defective products by subjecting the chip to such a hard condition that voltages higher or lower than those in a normal operation mode are applied to the chip. Other conditions such as a temperature condition, etc. than the voltage condition in an aging test are not specifically limited. For example, voltages VDDQ=3.3 V and VDD=1.5 V in a normal operation mode are changed to 4.5 V and 3.0 V respectively in an aging mode.

In FIG. 34, the voltage vsw indicating the shift to the aging test is 2.5 V. A comparator designated by the reference numeral 1603 detects the fact that the voltage VDD is larger than the voltage vsw. When VDD>vsw, the gate signal of a transistor M1611 changes from the VSS potential to the VDD potential. A comparator 1601 determines the gate potential of a transistor M1607 while comparing the voltage of VREF1 with a tap voltage based on interior division of the voltage of VREF3 by resistors R1605 and R1606. When the voltage of VREF3 is lower than (R1605+R1606)/R1606× VREF1=2.0 V, the comparator 1601 acts on the transistor M1607 to increase the VREF3 potential. On the other hand, a comparator 1602 determines the gate voltage of a transistor M1610 while comparing the voltage input to the gate of the transistor M1611 with a tap voltage based on interior division of the voltage of VREF3 by resistors R1608 and R1609. When the voltage of VREF3 is lower than (R1608+ R1609)/R1609×(gate voltage of M1611), the comparator 1602 acts on the transistor M1610 to increase the VREF3 potential. Hence, when VDD<vsw, the comparator 1602 is substantially turned off because the gate voltage of the transistor M1611 becomes zero. As a result, a voltage of 2.0 V is output at VREF3 by the comparator 1601. When VDD>vsw, the gate voltage of the transistor M1611 becomes equal to the voltage VDD. As a result, the comparator 1602 controls the voltage of VREF3 to be (R1608+ R1609)/R1609×VDD. If (R1608+R1609)/R1609 is set to be equal to 1.25, the voltage of VREF3 is controlled to be (R1608+R1609)/R1609×VDD=1.25×VDD. Because this voltage is higher than 2.0 V, the comparator 1601 is substantially turned off. Finally, the voltage of VREF3 is output at VINT1 through a buffer 1604.

Figure 35:
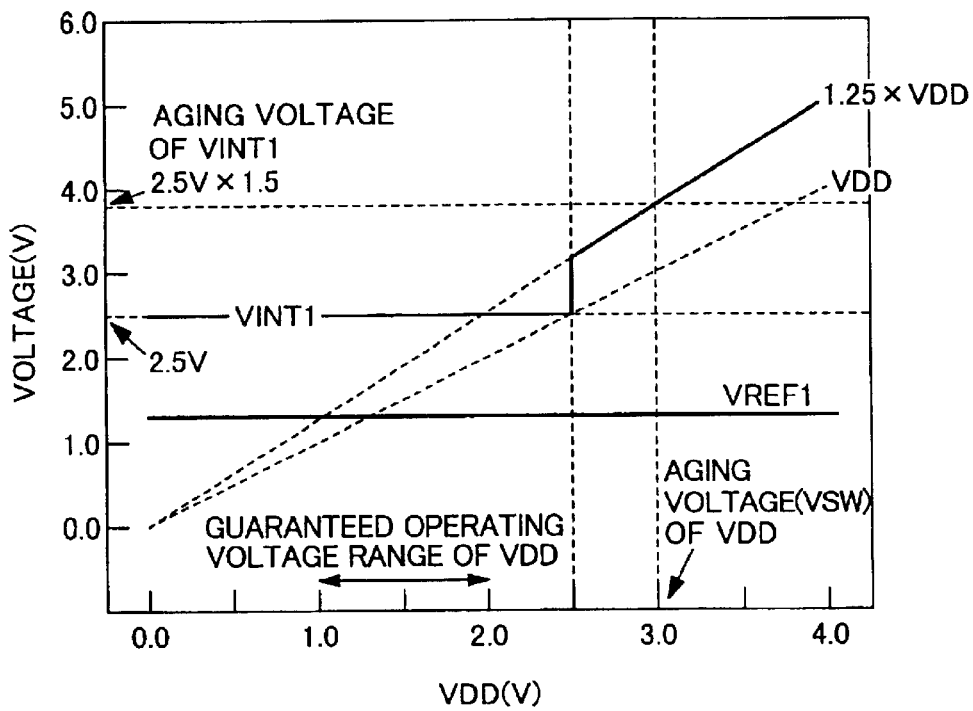
FIG. 35 is a graph showing an example of operating characteristic of the voltage down-converter in FIG. 34.
Figure 36:
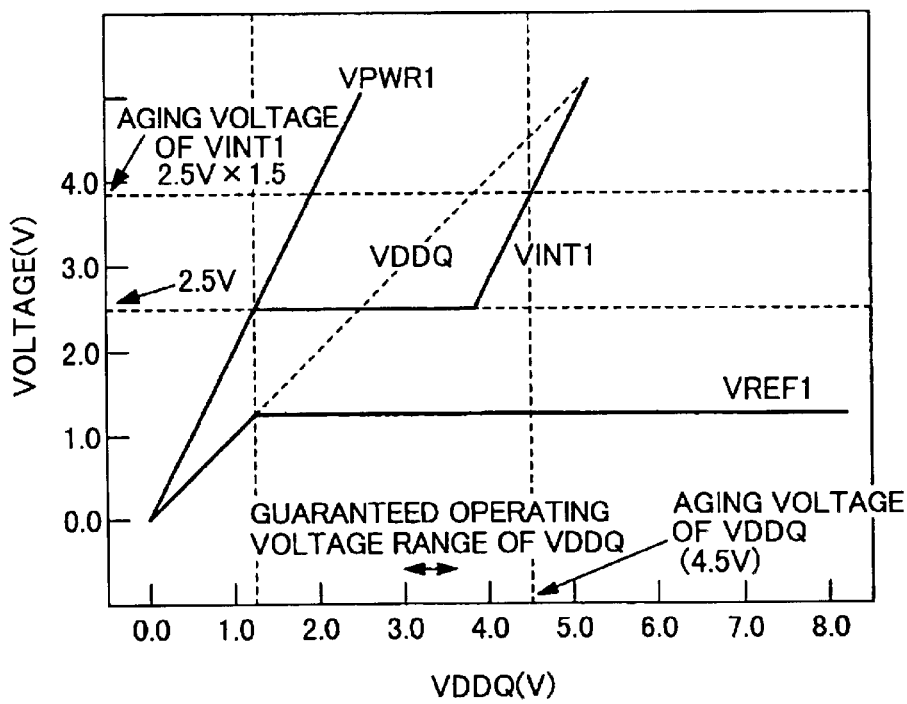
FIG. 36 is a graph showing another example of operating characteristic to be Formed by the voltage down-converter.

FIG. 35 shows the voltage characteristic of the internal voltage VINT1 generated by the circuit shown in FIG. 34. In the circuit shown in FIG. 34, VINT1 is programmed to have the characteristic of VINT1=1.25×VDD when VDD exceeds 2.5 V (=vsw). When the aging voltage of VDD is 3.0 V, a voltage of 2.5×1.5 V=3.75 V can be applied as the aging voltage of VINT1.

Although the circuit in FIG. 34 has shown the case where the voltage VINT1 is used as an aging voltage by detecting the change of the power-supply voltage supplied from the outside, the present invention may be applied also to the case where a command, or the like, is used to change the state of the chip to an aging state different from the normal operating state of the chip so that the voltage VINT1 is used as an aging voltage in the aging state.

Although the characteristic example in FIG. 35 has shown the case where the characteristic of VINT1 is changed by detecting the fact that the voltage VDD exceeds the normal guaranteed operating voltage range, the present invention may be applied also to the case where the characteristic of VINT1 is changed by detecting the fact that the voltage VDDQ exceeds the normal guaranteed operating voltage range. That is, when VDDQ exceeds about 3.9 V, VINT1 increases linearly in proportion to VDDQ. VINT1 is programmed to be 2.5×1.5 V when the aging voltage of VDDQ is 4.5 V.

FIGS. 37(A) and 37(B) show modified examples of a current mirror circuit used in a differential amplifier of the voltage limiter circuit. One of the features of the aforementioned circuit is that its power-supply noise removal ratio is high as described above. The power-supply noise removal ratio can be enhanced by the structure of a phase compensatory circuit as described in Reference 4. The power-supply noise removal ratio can be also enhanced by the change of configuration of the current mirror circuit. FIG. 37 shows examples of a Cascoded current source and a Wilson current source respectively. By means of these circuits, noise superposed on VINT1 output can be further reduced.

Main effects obtained by typical embodiments of the present invention disclosed in this specification are, in brief, as follows.

(1) In a chip comprising I/O circuits as signal interface circuits for communicating with the outside of the chip, at least one first circuit block including a logic circuit such as an NAND circuit, a register or static memory circuit, a microprocessor or DSP circuit, and so on, and at least one second circuit block using various kinds of voltages and including analog circuits such as an AD converter, a DA converter and a PLL, DRAM circuits and circuits such as a flash memory, the power-supply voltage used in the inside of the second circuit block can be provided stably with high power efficiency.

(2) The power-supply noise interference of the I/O circuit with the first and second circuit blocks can be reduced.

(3) Even in the case where a power-supply voltage given from the outside of the chip or a power-supply voltage generated from the power-supply voltage is reduced, the chip as a whole can be operated at a high speed.

What is claimed is:

1. A semiconductor device formed on a semiconductor chip comprising:
    a first circuit block supplied with a first operating voltage;
    a second circuit block supplied with a second operating voltage lower than said first operating voltage;
    a voltage generating circuit generating a third operating voltage in response to said first operating voltage; and
    a third circuit block supplied with said third operating voltage;
    wherein said voltage generating circuit includes a fourth circuit that outputs the third operating voltage which is a function of said first operating voltage, and a rate of a change of the third operating voltage to said first operating voltage varies from a first rate of change to a second rate of change greater than the first rate of change when said first operating voltage is higher than a first voltage.

2. The semiconductor device according to claim 1, wherein said third operating voltage is lower than said first operating voltage.

3. The semiconductor device according to claim 2, wherein said first voltage is a voltage higher than a voltage used for normal operation and wherein said fourth circuit controls the third operating voltage when an aging test is operated.

4. The semiconductor device according to claim 2, wherein said third circuit block further includes a charge pump circuit and a regulator circuit;
    wherein said charge pump circuit receives said first operating voltage and outputs a voltage inputted to said regulator circuit,
    wherein said regulator circuit includes a plurality of diodes and a first transistor;
    wherein said plurality of diodes are which is coupled in series between an output of said charge pump circuit and said source/drain path of said first transistor; and
    wherein said third operating voltage is outputted from an output of said first transistor.

5. The semiconductor device according to claim 4, wherein said plurality of diodes comprise a plurality of second transistors which have the same thickness of gate insulators of third transistors used in input and output circuits.

6. The semiconductor device according to claim 5, wherein said second transistors are N type MOS transistors.

7. The semiconductor device according to claim 4, wherein said third circuit block comprises a memory array having a plurality of DRAM memory cells.

* * * * *